US009558903B2

(12) United States Patent
Becker et al.

(10) Patent No.: US 9,558,903 B2
(45) Date of Patent: Jan. 31, 2017

(54) MEMS-BASED SWITCHING SYSTEM

(71) Applicant: NATIONAL INSTRUMENTS CORPORATION, Austin, TX (US)

(72) Inventors: Alvin G. Becker, Austin, TX (US); James A. Reimund, Georgetown, TX (US); Kevin R. Kreitz, Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 15/069,405

(22) Filed: Mar. 14, 2016

(65) Prior Publication Data

US 2016/0196940 A1 Jul. 7, 2016

Related U.S. Application Data

(63) Continuation-in-part of application No. 13/461,881, filed on May 2, 2012, now Pat. No. 9,287,062.

(51) Int. Cl.
*H01H 50/04* (2006.01)
*H01H 51/30* (2006.01)
(Continued)

(52) U.S. Cl.
CPC .............. *H01H 50/04* (2013.01); *G01R 1/206* (2013.01); *H01H 50/10* (2013.01); *H01H 50/36* (2013.01); *H01H 51/30* (2013.01); *H01P 1/15* (2013.01); *H01P 5/12* (2013.01); *H04Q 3/545* (2013.01); *H01H 1/403* (2013.01); *H01H 50/005* (2013.01); *H01H 2001/0073* (2013.01); *H01H 2057/006* (2013.01); *H04Q 2213/003* (2013.01); *H04Q 2213/141* (2013.01); *H04Q 2213/16* (2013.01)

(58) Field of Classification Search
CPC ................................ H01H 67/22; H01P 1/127
IPC ......................................................... H01P 1/127
See application file for complete search history.

(56) References Cited

U.S. PATENT DOCUMENTS 1,374,201 A 4/1921 Hall
1,844,256 A 2/1932 Langer
(Continued)

FOREIGN PATENT DOCUMENTS

DE  WO 2012019732 A1  2/2012
EP  0594807 B1  5/1994

OTHER PUBLICATIONS

"Sorting Networks and the END search algorithm," Brandeis University, retrieved Feb. 21, 2013 from <http://www.cs.brandeis.edu/-hugues/ sorting_networks.html> (3 pages).

(Continued)

*Primary Examiner* — Mohamad Musleh
(74) *Attorney, Agent, or Firm* — Meyertons Hood Kivlin Kowert & Goetzel, P.C.; Jeffrey C. Hood; Bradley M. Parro

(57) ABSTRACT

A switching element that is at least partially implemented in one or more printed wiring boards (PWBs). A plurality of inputs and a plurality of outputs may be integrated into the PWB(s). In some embodiments, a plurality of contact bars may also be comprised in respective contact bar pockets bounded at least partially ab at least one of the PWB(s). The switching element is selectively operable in first and second states, the first state in which at least one contact bar couples one of the plurality of inputs to one of the plurality of outputs such that an analog signal input to the respective input is routed to the respective output and the second state in which at least one contact bar is held in an off state.

20 Claims, 18 Drawing Sheets

(51) Int. Cl.

| | |
|---|---|
| H01H 50/10 | (2006.01) |
| H01H 50/36 | (2006.01) |
| G01R 1/20 | (2006.01) |
| H01P 1/15 | (2006.01) |
| H04Q 3/545 | (2006.01) |
| H01P 5/12 | (2006.01) |
| H01H 1/40 | (2006.01) |
| H01H 50/00 | (2006.01) |
| H01H 1/00 | (2006.01) |
| H01H 57/00 | (2006.01) |

(56) References Cited

U.S. PATENT DOCUMENTS

| | | | |
|---|---|---|---|
| 3,922,537 | A | 11/1975 | Jackson |
| 4,300,207 | A | 11/1981 | Eivers |
| 5,377,182 | A | 12/1994 | Monacos |
| 5,475,353 | A | 12/1995 | Roshen |
| 5,774,427 | A | 6/1998 | Rebeaud |
| 5,932,936 | A | 8/1999 | Potthast |
| 6,525,280 | B2 | 2/2003 | Chan |
| 6,531,668 | B1 | 3/2003 | Ma |
| 6,741,479 | B2 | 5/2004 | Korber |
| 6,849,924 | B2 | 2/2005 | Allison |
| 6,880,235 | B2 | 4/2005 | Ma |
| 6,940,363 | B2 | 9/2005 | Zipper |
| 7,446,634 | B2 | 11/2008 | Jeong |
| 7,737,810 | B2 | 6/2010 | Chan |
| 8,154,365 | B2 | 4/2012 | Chan |
| 8,203,319 | B2 | 6/2012 | Fujita |
| 8,270,054 | B2 | 9/2012 | Kim |
| 8,300,422 | B2 | 10/2012 | Nagasaki |
| 8,339,764 | B2 | 12/2012 | Steeneken |
| 8,847,715 | B2 | 9/2014 | Wilson |
| 2005/0139941 | A1 | 6/2005 | Allison |
| 2005/0259491 | A1 | 11/2005 | Yarbrough |
| 2005/0270137 | A1 | 12/2005 | Yarbrough |
| 2007/0296401 | A1 | 12/2007 | Reimund |
| 2010/0277267 | A1 | 11/2010 | Bogert |
| 2011/0127853 | A1 | 6/2011 | Fujita |
| 2012/0262007 | A1 | 10/2012 | Becker |
| 2012/0262008 | A1 | 10/2012 | Becker |
| 2012/0262009 | A1 | 10/2012 | Becker |
| 2012/0286588 | A1 | 11/2012 | Steeneken |
| 2012/0286846 | A1 | 11/2012 | Wunnicke |
| 2012/0313723 | A1 | 12/2012 | Rofougaran |
| 2012/0318650 | A1 | 12/2012 | Peroulis et al. |

OTHER PUBLICATIONS

"Sorting Networks;" University of Illinois at Urbana-Champaign, Mar. 2, 2005, retrieved Feb. 21, 2013 from <http://valis.cs.uiuc.edu/-sariel/teach/2004/b/webpage/lec/14_sortnet_notes.pdf>; pp. 1-9 (9 pages).

Lang, H.W.; "Sorting networks: Bitonic sort;" Flensburg University of Applied Sciences, Flensburg, Germany, created May 3, 1997, retrieved Feb. 21, 2013 from <http://www.iti.fh-flensburg.de/lang/algorithmen/sortieren/bitonic/bitonicen.htm>; pp. 1-7 (7 pages).

Lang, H.W.; "Sorting networks: Odd-even mergesort;" Flensburg University of Applied Sciences, Flensburg, Germany, created Jan. 31, 1998, retrieved Feb. 21, 2013 from <http://www.iti.fh-flensburg.de/lang/algorithmen/sortieren/networks/oemen.htm>; pp. 1-4 (4 pages).

Lang, H.W.; "Sorting networks: Shellsort" Flensburg University of Applied Sciences, Flensburg, Germany, created Jan. 29, 1998, retrieved Feb. 21, 2013 from <http://www.iti.fh-flensburg.de/lang/algorithmen/sortieren/shell/shellen.htm>; pp. 1-6 (6 pages).

Wolfram, Stephen; "Sorting Networks;" Wolfram Demonstrations Project, Wolfram Mathematica, retrieved Feb. 21, 2013 from <http://demonstrations.wolfram.com/SortingNetworkst>; pp. 1-2 (2 pages).

"Sorting Networks;" University of Kentucky—Computer Science Department, retrieved Feb. 21, 2013 from <http://cs.engr.uky.edu/-lewis/essays/algorithms/sortnets/sort-net.html>; pp. 1-5 (5 pages).

Gamble, John M.; "Sorting Networks;" Ripco Communication, retrieved Feb. 21, 2013 from <http://pages.ripco.net/-gamble/nw.html>; (1 page).

Lang, H.W.; "Sorting networks: The 0-1-principle;" Flensburg University of Applied Sciences, Flensburg, Germany, created Feb. 2, 1997, retrieved Feb. 21, 2013 from <http://www.iti.fh-flensburg.de/lang/algorithmen/sortieren/networks/nulleinsen.htm>; pp. 1-2 (2 pages).

Wikipedia Website: "Bubble sort;" version as of Jan. 3, 2011, retrieved Feb. 21, 2013 from <http://en.wikipedia.org/w/index.php?tille~Bubble_sort&oldid~405639877>, pp. 1-6 (6 pages).

Martin, David R.; "Sorting Algorithm Animations;" 2007, retrieved Feb. 21, 2013 from <http://www.sorting-algorithms.com/>; pp. 1-2 (2 pages).

Chan et al.; "Scalable RF MEMS Switch Matrices: Methodology and Design;" IEEE Transactions on Microwave Theory and Techniques, vol. 57, No. 6, Jun. 2009; pp. 1612-1621 (10 pages).

Chan et al.; "Monolithic Crossbar MEMS Switch Matrix:" IEEE MTT-S International Microwave Symposium Digest, Jun. 15-20, 2008; pp. 129-132 (4 pages).

Daneshmand, M.; Mansour, R.R.; "Monolithic RF MEMS Switch Matrix Integration;" IEEE MTI-S International Microwave Symposium Digest, Jun. 11-16, 2006, pp. 140-143 (4 pages).

Daneshmand, M. and Mansour, R.R.; "C-type and R-type RF MEMS Switches for Redundancy Switch Matrix Applications;" IEEE MTT-S International Microwave Symposium Digest, Jun. 11-16, 2006; pp. 144-147 (4 pages).

Marcus, Michael J.; "The Theory of Connecting Networks and Their Complexity: A Review:" Proceedings of the IEEE, vol. 65, No. 9, Sep. 1977; pp. 1263-1271 (9 pages).

MEMS-BASED SWITCHING SYSTEM

RELATED APPLICATION DATA

This application is a continuation-in-part of U.S. patent application Ser. No. 13/461,881, filed on May 2, 2012, entitled "MEMS-based Switching System," invented by Alvin G. Becker and James A. Reimund. The above-identified patent application is hereby incorporated by reference in its entirety as though fully and completely set forth herein.

BACKGROUND

A relay is an electrical switch that opens and closes an electrically conductive path under the control of another electrical circuit. A switch matrix typically includes a plurality of relays used to selectively interconnect electrical paths for routing a signal. By opening and closing one or more relays within the switch matrix, a conductive path is created, thereby enabling a signal to be routed through the switch matrix. For example, a particular set of relays may be closed to connect a given input to a given output of the switch matrix. Switching is often implemented in test and measurement systems to automate routing of signals from one device to another. For example, a measurement device (e.g., voltmeter) may be coupled to an output of a switch having a plurality of inputs each coupled to a respective device under test (DUT). During operation, the measurement device may be used to take measurements from each of the DUT's by sequentially closing sets of relays, one after the other, to sequentially connect the inputs of the switch to outputs for each of the DUTs. Accordingly, switches may provide for simplified wiring, such that a test system can easily and dynamically modify internal connection paths without external manual intervention (e.g., without a user having to physically reroute cabling between devices). Similar switching techniques may be used in various operations that require dynamic routing of signals between devices. Current systems, however, use switches that are either large and expensive or lack robustness or power handling capability.

SUMMARY

Described herein are embodiments relating to switching elements systems and methods. For example, in some embodiments, provided is a switching element that is at least partially implemented in one or more printed wiring boards (PWB) (or one or more sheets of a PWB). A plurality of inputs and a plurality of outputs may be integrated into the one or more PWBs. The switching element may include a plurality of electromagnets coupled to or comprised in at least one of the one or more PWBs. The switching element may include a plurality of contact bars. Each contact bar may be comprised in a respective contact bar pocket bounded at least partially by at least one of the PWBs. Each contact bar by comprise a conductive metal or alloy that is attracted by a magnetic field. Each contact bar may be selectively operable, via actuation by an externally applied magnetic field of a respective one of the plurality of electromagnets in respective states. For example, the switching element may be selectively operable in a first state, wherein the at least one contact bar couples one of the plurality of inputs to one of the plurality of outputs such that an analog signal input to the respective input is routed to the respective output. The switching element may also be selectively operable in a second state, wherein the at least one contact bar is held in an off state.

BRIEF DESCRIPTION OF THE DRAWINGS

A better understanding of the present disclosure can be obtained when the following detailed description is considered in conjunction with the following drawings, in which.

Figure 1A:
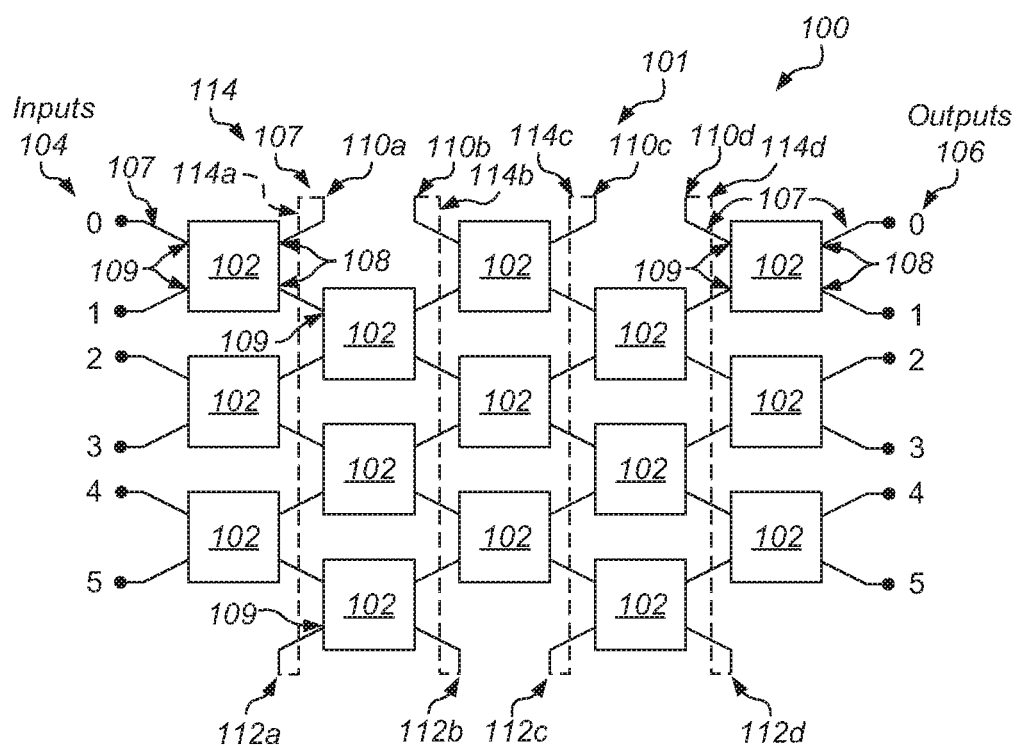
FIG. 1A is a diagram that illustrates a cylindrical matrix switch topology in accordance with one or more embodiments.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the intention is to cover all modifications, equivalents, and alternatives falling within the spirit and scope of the present disclosure as defined by the appended claims. It is noted that the word "may" is used throughout this application in a permissive sense (e.g., having the potential to, being able to), not a mandatory sense (e.g., must).

DETAILED DESCRIPTION

In the following description, numerous specific details are set forth to provide a thorough understanding of embodiments of the present disclosure. However, one having ordinary skill in the art should recognize that the disclosure may be practiced without these specific details. In some instances, well-known circuits, structures, and techniques have not been shown in detail to avoid obscuring the present disclosure.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, for a switch element having first and second inputs, the terms "first" and "second" inputs can be used to refer to either of the inputs. In other words, the "first" and "second" inputs are not limited to logical inputs 0 and 1.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Memory Medium"—A memory medium is a medium configured for the storage and retrieval of information. Examples of memory media include: various kinds of semiconductor memory such as RAM and ROM; various kinds of magnetic media such as magnetic disk, tape, strip and film; various kinds of optical media such as CD-ROM and DVD-ROM; various media based on the storage of electrical charge and/or other physical quantities; media fabricated using various lithographic techniques; etc. The term "memory medium" may also include a set of two or more memory media which reside at different locations, e.g., at different computers that are connected over a network.

This application incorporates by reference U.S. patent application Ser. No. 13/087,154 entitled "SWITCHING ELEMENT SYSTEM AND METHOD" by Becker, et al. filed on Apr. 14, 2011, and co-pending U.S. patent application Ser. No. 13/087,064 entitled "SWITCH MATRIX MODELING SYSTEM AND METHOD" by Becker, et al. filed on Apr. 14, 2011, and U.S. patent application Ser. No. 13/087,198 entitled "SWITCH MATRIX SYSTEM AND METHOD" by Becker, et al. filed on Apr. 14, 2011, each of which is incorporated by reference in its entirety as though fully and completely set forth herein.

As discussed in more detail below, certain embodiments include systems and methods relating to switches. The specification first describes various switch topologies that may be suited for use with the disclosed switches and switching techniques. Then, the specification describes various example switching elements, followed by an example method for operating a switching element. Finally, the specification describes a system that may implement the disclosed switches and switching topologies.

Turning to the figures, FIG. 1A is a diagram that illustrates a cylindrical matrix switch topology 100 in accordance with one or more embodiments. Cylindrical matrix switch topology 100, as well as other switch topologies described herein, may be representative of the topology of a switch used to provide a connection between a plurality of inputs and outputs. The inputs and outputs may include, for example, physical input/output (I/O) pins of a configurable switching module, such as those described below at FIG. 25. In some embodiments, cylindrical matrix switch topology 100 includes a cylindrical switch matrix ("switch matrix") 101 including a plurality of switching elements 102 that may be selectively operated to connect (e.g., electrically couple) inputs 104 and outputs 106. For example, in the illustrated embodiment, topology 100 includes a 6×6 cylindrical matrix topology including six inputs 104 (0-5) and six outputs 106

(0-5). Any of inputs 104 may be connected to any of outputs 106 via switching elements 102. Each one of inputs 104 may be selectively connected to one of outputs 106. In some embodiments, at any given time, each of inputs 104 is connected to different ones of outputs 106 such that no two inputs are connected to the same output. Matrix 101 may include the same number of inputs and outputs. Although matrix 100 may be illustrated as a 6×6 matrix in an attempt to simplify the discussion provided herein, it will be appreciated that cylindrical switch topology 100 may include larger or smaller matrices (e.g., 9×9, 8×8, 4×4, etc.) having various number of inputs and outputs.

In some embodiments, inputs 104 and outputs 106 may provide for the routing of signals into and out of switch matrix 101. For example, in the illustrated embodiment, an input 104 may provide a path for an input signal to be provided into switch matrix 101, the signal may be routed via switching matrix 101 such that the routed signal exits switch matrix 101 via an output 106.

In some embodiments, switching elements may include multi-dimensional switching elements. For example, each of the switching elements may include a 2×2 switching elements, 4×4 switching elements, 8×8 switching elements, and so forth. In the illustrated embodiment, each of switching elements 102 includes a 2×2 switching element. For example, each of switching elements 102 includes two inputs (e.g., input terminals) and two outputs (e.g., output terminals). As described below at FIGS. 6 and 7, pairs/sets of signals may be routed in a substantially similar manner by employing, at each of the switching element locations 102, larger dimension switching elements (e.g., 4×4 and 8×8) and/or multiple 2×2 switching elements to effectively provide functionality of larger dimensioned switching elements (e.g., multi-wire signal routing). Moreover, in various embodiments, in addition to N×N switches, switching elements may be used as a single-pole double-throw (SPDT) which may also be referred to as a 1×2 switching element, a multiplexer (e.g., 4×1, 16×1, etc.), an attenuator section, or other switching configurations (e.g., 2×3, etc.).

In some embodiments, each of switching elements 102 is coupled to another of switching elements 102 via interconnects 107. Interconnects 107 may include conductive path that provides for the routing of an electrical signal between two elements/components. For example, interconnects 107 may include a conductive (e.g., metal) trace located on a printed wiring board (PWB) (or printed circuit board (PCB)). As depicted interconnects 107 may couple an output 108 (e.g., output terminal) of one of switching elements 102 to an input 109 (e.g., input terminal) of another one of switching elements 102. Interconnects may also be provided to couple inputs 104 to inputs 109 of switching elements 102 and/or outputs 106 to outputs 108 of switching elements 102. In other embodiments, interconnects may be input/output traces that are part of a given switching element so that no relays may be needed to connect various switching elements.

In some embodiments, switch matrix 101 may include interconnects 107 that seamlessly wrap the matrix back onto itself. All of the inputs and outputs of each of the switching elements may be coupled to an input 104, an output 106, or other corresponding outputs or inputs of other switching elements. For example, as depicted in the illustrated embodiment, each interconnect 107 extending from switching elements 102 located at a top edge/row of switch matrix 101 includes a portion 110a-110d that may be coupled to a complementary portion 112a-112d of switching elements 102 located at a bottom edge/row of switch matrix 101 (e.g., located on a edge of switch matrix 101 that is physically opposite from the top row). Each of portions 110a-110d may be coupled to corresponding portions 112a-112d, respectively, via wrapping interconnects 114 extending there between. For example, in the illustrated embodiment, portion 110a is coupled to portion 112a via wrapping interconnect portion 114a. As depicted, similar wrapping interconnect portions 114b-114d may be provided for connecting each of portions 110b-110d to portions 112b-112d, respectively.

Traces/paths for interconnects 107 and/or wrapping interconnect portions may be routed in any manner to avoid collision/shorting/blocking of the traces/paths with one another. In some embodiments, wrapping interconnect portions (e.g., portion 114a) may include a trace that is provided in a plane of a PWB other than the plane containing interconnects 107. For example, wrapping interconnect portions may be located on a back side/face of, or in one or more internal layers of, a PWB having switch matrix 101 interconnects 107 and/or switching elements 102 disposed on the front side/face of the PWB. Similarly, where interconnects 107 are disposed in layer of the PWB, interconnect portions may be located on a back or front side/face or in one or more other internal layers of the PWB.

Switch matrix 101 may have a topology such that it may be physically laid out on a cylindrical/tubular shaped PWB such that the top row and bottom row of switching elements 102 are adjacent one another (e.g., at a seam running along the cylinder) and are coupled to one another using interconnects having paths similar to that for switching elements 102 located in a central region of switch matrix 101. That is, the cylindrical topology of switch matrix 101 may enable the switch matrix 101 to take the physical shape of a cylinder such that portions 110a-110d directly coupled to one another (such that wrapping interconnects (e.g., 114a-114d) are not required). Inputs 104 and outputs 106 may be located at opposite ends of the cylinder.

Switch matrix 101 may include enough switching elements such that any input can be routed to any output. In the illustrated embodiment, the 6×6 switch matrix 101 includes fifteen 2×2 switching elements. Note that in other embodiments (e.g., in a compact sorting network style matrix, a full 6×6 matrix may include only twelve 2×2 switching elements. In some embodiments, each of the 2×2 switching elements may include a single 2-Form-C relay, or two 1-Form-C relays, for a total of fifteen 2-Form-C relays or thirty 1-Form-C relays. It is noted that a conventional 6×6 cross-point matrix (often employed for RF switching) may require seventy 1-Form-C relays. Accordingly, switch matrix 101 may significantly reduce the number of relays (e.g., the cost of relays) by about 50% or more. A 4×4 cylindrical switch matrix 101 may include six 2×2 switching elements, and an 8×8 cylindrical switch matrix 101 may include twenty-eight 2×2 switching elements. An 8×8 compact sorting network style matrix may include only sixteen 2×2 switching elements. In some embodiments, switching elements 102 may include various forms, such as the switching elements depicted and described herein at FIGS. 8-24.

In some embodiments, a minimum number of switching elements may be provided to enable any input to be routed to any output. In some instances, however, a blocking condition may occur such that two paths conflict with one another, thereby not allowing a particular one or more of the inputs to a particular one or more of the outputs simultaneously. In some embodiments, additional switching elements (e.g., more than the minimum number of switching elements to enable any input to be routed to any output) may be provided to reduce or eliminate the likelihood of a blocking condition occurring. Thus, such additional switching elements may ensure that signals can be routed from any input to any output destination simultaneously. For example, with the use of additional switching elements, multiple/redundant pathways may exist between a given input and a given output such that the signal can be routed on a redundant pathway in the instance where one of the possible pathways is blocked (e.g., used by another path connecting another of the inputs to another of the outputs). In some embodiments, a blocking condition may be created by a non-functioning switching mechanism (e.g., a relay/switching element stuck in given state/position). Thus, redundant pathways may be used to route signals around problematic or non-functioning switching mechanism.

Figure 1B:
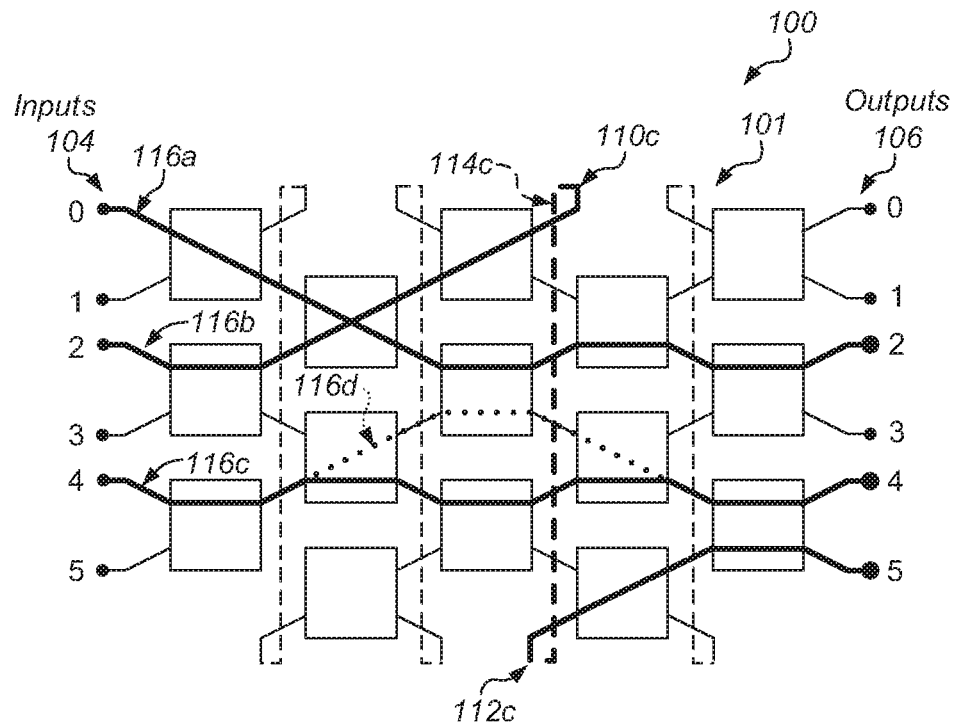
FIG. 1B is a diagram that illustrates example paths through the cylindrical matrix switch topology of FIG. 1A in accordance with one or more embodiments.

FIG. 1B is a diagram that illustrates exemplary paths through cylindrical matrix switch topology 100 in accordance with one or more embodiments of the present technique. For example, a first exemplary path 116a may connect input 0 to output 2. As depicted, the signal may be routed into switch matrix 101 from input 0, routed/swapped through a first input and a second output of each of the first two switching elements, routed straight through respective inputs and corresponding outputs of each of the third, fourth, and fifth switching elements, and exit switch matrix 101 at output 2.

A second exemplary path 116b may connect input 2 to output 5. As depicted, a signal may be routed into switch matrix 101 from input 2 on path 116b. As depicted, the signal may be routed straight through the first switching element, the signal may be routed/swapped from a second input to a first output of each of the second and third switching elements, from a first output of the third switching element to a second input of a fourth switching element via a wrapping interconnect portion 114c, routed/swapped from a second input to a first output of the fourth switching element, routed straight through the fifth switching element, and exit switch matrix 101 at output 5.

A third exemplary path 116c may connect input 4 to output 4. As depicted, a signal may be routed into switch matrix 101 from input 4 on path 116c, routed straight through each of the five switching elements, exiting switch matrix 101 at output 4.

In the illustrated embodiment, a fourth exemplary path 116d includes a path that may be redundant to path 116c. That is, path 116d may enable the same input and output to be connected to one another as provided by path 116c. Exemplary path 116d may include one or more portions of the path 116c as well as one or more additional (redundant) pathway portions, as indicated by the dotted line. As depicted, a signal may be routed into switch matrix 101 from input 4 on path 116d straight through the first switching element, routed/swapped through a second switching element, routed straight though a third switching element, routed/swapped through a fourth switching element, and routed straight through a fifth switching element, exiting switch matrix 101 at output 4. Thus, if the third switching element of path 116c were set to swap signals, as opposed to route the signal straight through, switch matrix 101 may route the signal on redundant path 116d (e.g., as opposed to path 116c) between input 4 and output 4. A similar routing may occur where the third switching element of path 116c was defective (e.g., stuck in a swapping state). Notably, the first, second, and third or fourth paths 116a, 116b, and 116c or 116d may be provided simultaneously.

Figure 1C:
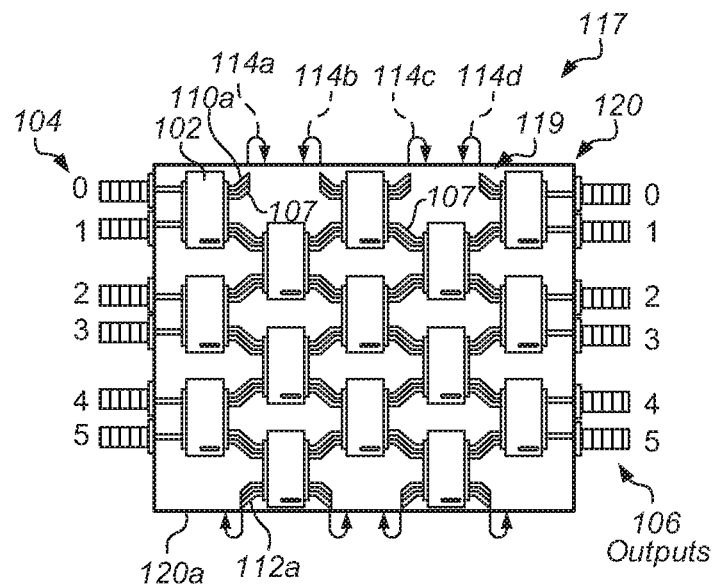
FIG. 1C is a diagram that illustrates a cylindrical matrix switch system in accordance with one or more embodiments.

FIG. 1C is a diagram that illustrates a cylindrical matrix switch system 117 in accordance with one or more embodiments. Cylindrical matrix switch system 117 implements a switch matrix 119 (corresponding to switch matrix 101 and topology 100) provided on PWB 120. Switch matrix system 117 includes switching elements 102, inputs 104, outputs 106, and interconnects 107. PWB 120 may provide for mechanical support and electrically coupling electronic components using conductive pathways, tracks or traces etched from copper sheets laminated onto a non-conductive substrate, for example. In some embodiments, switching elements 102 may be coupled to PWB 120. For example, in the illustrated embodiment, switching elements 102 may be provided on a top/front surface 120a of PWB 120. Switching elements may be coupled to one another via interconnects (e.g., trace(s) and/or via(s)) 107 provided on or within layers of PWB 120 as discussed above at FIG. 1A. In some embodiments, switching elements 102 may be coupled to the front and/or back side of PWB 120. For example, two 1-Form-C relays may be used on the same or opposite sides of PWB 120 at or near each location of switching elements 102. In other embodiments, where the switching element is within a PWB, relays may not be required or may be greatly reduced in quantity and size. In some embodiments, wrapping interconnect portions 114a-114d, similar to those described above, may be provided in a plane of a PWB other than the plane containing interconnects 107. For example, interconnect portions 114a-114d may be located on a back side/face or within one or more internal layers of PWB 120. Inputs 104 and/or outputs 106 may include micro coaxial (MCX) connectors, Bayonet Neill-Concelman (BNC) connectors, SubMiniature (SMA/SMB) connectors, or the like.

In some embodiments, all paths through switch matrix 101 and/or 119 may have substantially the same or identical electrical length and time delay. Further, switch matrix 101 may enable physical routing of signal traces on a PWB without signals crossing over one another. Thus, a PWB layout may be simplified as substantially all of the signal traces between switching elements may be provided on/in a single PWB layer, with only wrapping interconnect portions having to be provided on/in a separate PWB layer. Moreover, as described herein, various 2×2 switching elements 102 may provide substantially stub-less contiguous paths (e.g., paths without conductive ends off-shooting into a dead-ends) in either states of the switching elements 102, thereby reducing stubbed paths within switch matrix 101 and providing a relatively stub-less signal path though switch matrix 101 and cylindrical matrix switch topology 100.

In some embodiments, additional relays may be added to switch matrix topologies described herein to provide a disconnect between one or more of inputs/outputs and the respective switch matrices depicted and described herein. For example, additional relays may be added to provide a disconnect between one or more of inputs 104/outputs 106 and switch matrix 101 of cylindrical matrix switch topology 100. In some embodiments, at least one relay may be added to some or all of inputs 104 and outputs 106. For example, a 1-Form-C relay may be added at some or all of the nodes (0-7) of inputs 104 and nodes (0-7) of outputs 106 such that each of inputs 104 and each of outputs 106 may be electrically disconnected from switch matrix 101. The relays may be operated to selectively connect or disconnect each of inputs 104 and outputs 106 with switch matrix 101. Additional relays may be added in a similar manner to provide a disconnect between one or more of inputs 104/outputs 106 the switch matrices depicted and described herein.

In some embodiments, one or more redundant paths may be removed from or added to the respective switch matrices.

For example, one or more switching elements may be removed from switch matrix 101 of cylindrical matrix switch topology 100 to reduce the number of redundant pathways. Removing one or more redundant paths may enable a fewer number of switching elements to be used, thereby reducing the cost and complexity of layout of the switch matrix. One or more switching elements may be added to switch matrix 101 of cylindrical matrix switch topology 100 to increase the number of redundant pathways. Adding one or more redundant paths may provide additional redundant paths, thereby helping to prevent blocking conditions. Switching elements may be removed/added in a similar manner to the switch matrices depicted and described herein. In some embodiments, a minimum number of relays may be employed to enable each of the inputs 104 to be coupled to each of the outputs 106, as described above. Where one or more redundant paths are eliminated, however, it will be appreciated that a blocking condition may be more likely to occur if two or more signals are to be routed simultaneously on separate paths.

Figure 1D:
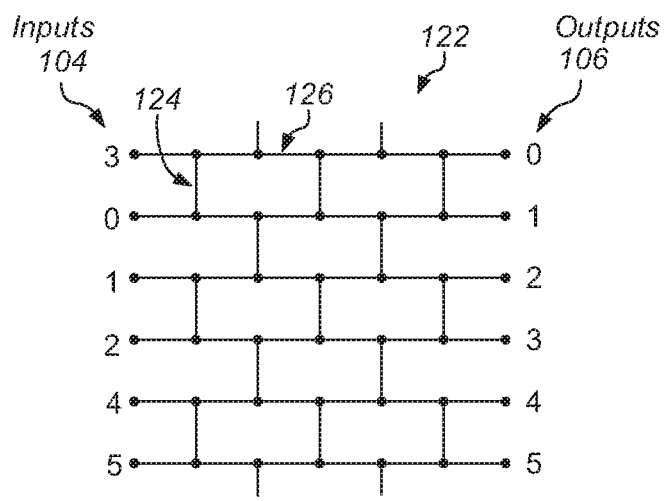
FIG. 1D is a sorting network notation model corresponding to the cylindrical switch matrix topology of FIGS. 1A-1C, in accordance with one or more embodiments.

In some embodiments, a switch matrix topology employing 2×2 switching elements may be modeled as, or otherwise associated with, a sorting network. For example, a switch matrix may be modeled using network notation representations wherein the plurality of switch inputs of the modeled switch matrix correspond to numerical inputs of the sorting network, the plurality of switch outputs of the modeled switch matrix correspond to the numerical outputs of the sorting network, and the 2×2 switching elements of the modeled switch matrix correspond to comparators of the sorting network. FIG. 1D is a sorting network notation model 122 corresponding to the 6×6 cylindrical switch matrix topology 100 of FIGS. 1A-1C, in accordance with one or more embodiments. Sorting network notation model 122 includes connectors 124 (e.g., vertical lines) corresponding to comparators of the sorting network and wires 126 (e.g., horizontal lines) corresponding to paths between the comparators. With regard to the switch matrix, connectors 124 may correspond to switching elements 102, and wires 126 may correspond to interconnects 107 (e.g., paths/traces) between the switching elements. Note that in some embodiments in which a switching element is at least partially implemented within a PWB, the number and length or wires 126, connectors 124, and interconnects 107 may be greatly reduced and/or eliminated. As described in more detail below, modeling a switch matrix topology as a sorting matrix may be used to design a switch matrix layout (e.g., determine a minimum number of switching elements required and the corresponding layout of interconnects to provide for simultaneous routing of any set of inputs to any set of respective outputs). Further, using the sorting matrix model, sorting algorithms/routines may be executed to determine how paths should be routed to provide a desired connection between inputs and outputs during use (e.g., states of the comparators/connectors 124 to provide the desired sort from an input to an output may be used to provide a corresponding routing). Techniques for implementing modeling of a switch matrix with a corresponding sorting network topology are described in more detail below.

Figure 2A:
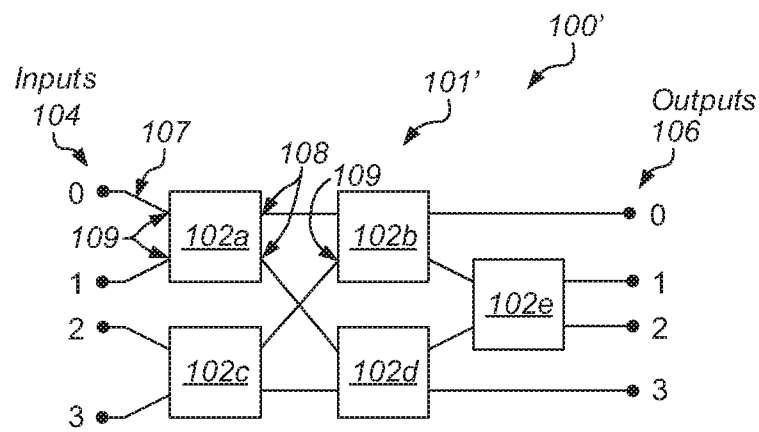
FIG. 2A is a diagram that illustrates an A-Type sorting network matrix switch topology in accordance with one or more embodiments.

FIG. 2A is a diagram that illustrates an A-Type sorting network matrix switch topology 100' in accordance with one or more embodiments of the present technique. A-Type sorting network matrix switch topology 100' includes a switching matrix 101' including a plurality of switching elements 102 that may be selectively operated to connect inputs 104 and outputs 106. In the illustrated embodiment, topology 100' includes a 4×4 A-Type matrix switch topology including four inputs 104 (0-3) and four outputs 106 (0-3). Notably, switching elements 102 are labeled as 102a-102e to enable identification of corresponding switching elements of FIG. 2A and FIG. 2B and to clarify later discussions relating to specific routing through the switching elements in association with exemplary techniques for sorting network modeling discussed below with regard to FIG. 2C. In some embodiments, any of inputs 104 may be connected to any of outputs 106 via switching elements 102. Each one of inputs 104 may be selectively connected to one of outputs 106. In some embodiments, at any given time, each of inputs 104 is connected to different ones of outputs 106 such that no two inputs are connected to the same output. Topology 100' may include the same number of inputs and outputs. Although A-Type matrix switch topology matrix 100' is illustrated as a 4×4 matrix, A-Type matrix switch topology 100' may include any size matrices (e.g., 5×5, 6×6, 8×8, 9×9, etc.) having corresponding numbers of inputs and outputs. Other embodiments may include matrices that do not have corresponding numbers of inputs and outputs (e.g., 4×12).

Signals may be routed through a switch matrix having A-type topology 100' in a manner similar to that described with respect to cylindrical topology 100 of FIGS. 1A, 1B, and 1C. For example, a signal may be routed from input 0 straight through switching elements 102a and 102b to output 0. A signal may be routed from input 1 straight through switching elements 102a and 102d, and be swapped at element 102e to output 1.

Figure 2B:
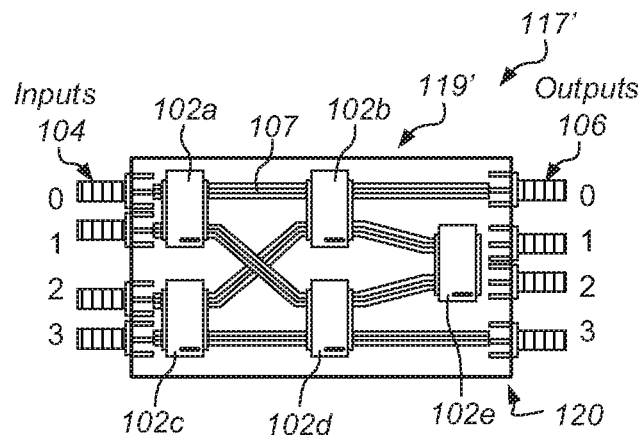
FIG. 2B is a diagram that illustrates an A-Type sorting network matrix switch system in accordance with one or more embodiments.
Figure 2C:
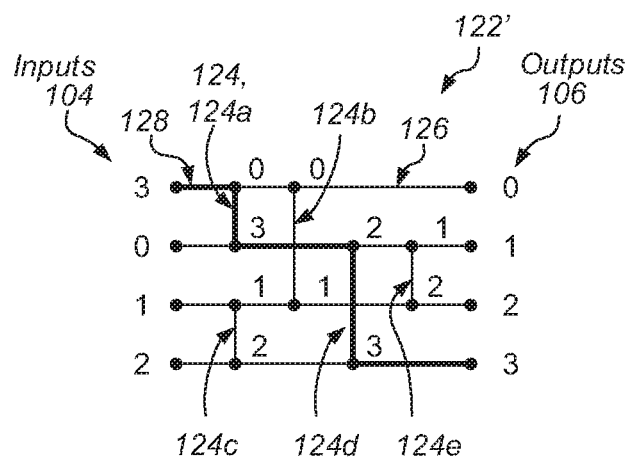
FIG. 2C is a sorting network notation model corresponding to the A-Type matrix switch topology of FIGS. 2A and 2B, in accordance with one or more embodiments.

FIG. 2B is a diagram that illustrates a 4×4 A-Type matrix switch system 117' in accordance with one or more embodiments of the present technique. The 4×4 A-Type matrix switch system 117' implements a switch matrix 119' (corresponding to switch matrix 101') provided on PWB 120. Switch system 117' includes switching elements 102, inputs 104, outputs 106, and interconnects 107. Switch system 117' may include features that are similar to that of switch system 117 described above. For example, interconnects may be disposed on faces or within layers of PWB 120. FIG. 2C is a sorting network notation model 122' corresponding to the 4×4 A-Type matrix switch topology 100' of FIGS. 2A and 2B, in accordance with one or more embodiments.

In some embodiments, all paths through switch matrix 101' and/or 119' may have substantially the same or identical electrical length and time delay. As described in more detail below, various 2×2 switching elements 102 may provide substantially stub-less contiguous paths (e.g., paths without conductive ends off-shooting into a dead-ends) in either states of the switching elements 102, thereby reducing stubbed paths within switch matrix 101' and providing a relatively stub-less signal path though switch matrix 101' and topology 100'. Some or all of 2×2 switching elements 102 may be other types of switching elements, such as 1×2 switching elements (SPDTs), 1×4 switching elements, 4×4 switching elements, 8×8 switching elements, and so forth. Pairs/sets of signals may be routed in a substantially similar manner by employing, at each of the switching element locations 102, larger dimension switching elements (e.g., 4×4 and 8×8) and/or multiple 2×2 switching elements to effectively provide functionality of larger dimensioned switching elements (e.g., multi-wire signal routing).

Figure 3A:
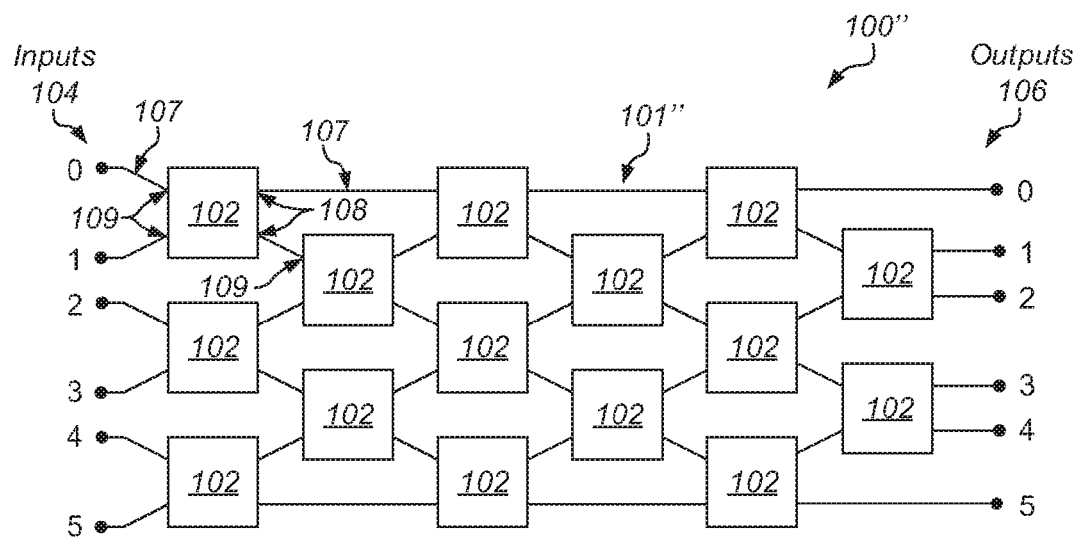
FIG. 3A is a diagram that illustrates a J-Type matrix switch topology in accordance with one or more embodiments.

FIG. 3A is a diagram that illustrates a J-Type matrix switch topology 100" in accordance with one or more embodiments. J-Type matrix switch topology 100" includes a switching matrix 101" including a plurality of switching elements 102 that may be selectively operated to connect inputs 104 and outputs 106. In the illustrated embodiment, topology 100" includes a 6×6 J-Type matrix switch topology including six inputs 104 (0-5) and six outputs 106 (0-5). J-Type matrix switch topology 100" may be similar to that of cylindrical switch topology 100 absent wrapping interconnects between the upper and lower rows of switching elements. Interconnects 107 may extend from the respective inputs and outputs of adjacent one of the switching elements on the upper and lower rows of switching elements. Relays previously provided for in certain locations of topology 100 (e.g., the two relays of the bottom row of FIG. 1A), may be moved to other locations within topology 100" (e.g., two relays located in the right column of FIG. 3A) to provide desired signal connectivity/routing. Such a design may reduce complexity of the switch layout. Notably, switching elements 102 may be provided between adjacent switching elements, such that none of the interconnects between cross-over one another. For example, topology 100" without cross-over of interconnects may be compared to topology 100' of FIGS. 2A and 2B that includes an interconnect between switching elements 102a and 102d crossing over interconnect between switching elements 102b and 102c. In some embodiments, any of inputs 104 may be connected to any of outputs 106 via switching elements 102. Each one of inputs 104 may be selectively connected to one of outputs 106. In some embodiments, at any given time, each of inputs 104 is connected to different ones of outputs 106 such that no two inputs are connected to the same output. Topology 100" may include the same number of inputs and outputs. Although J-Type matrix switch topology matrix 100" is illustrated as a 6×6 matrix, J-Type matrix switch topology 100" may include any size matrices (e.g., 4×4, 5×5, 8×8, 9×9, etc.) having corresponding numbers of inputs and outputs.

Signals may be routed through a switch matrix having J-type matrix switch topology 100" in a manner similar to that described with respect to topologies 100 and 100' and FIG. 1B. For example, a signal may be routed from input 0 straight through three switching elements 102 to output 0. A signal may be routed from input 1 straight through five switching elements 102, and be swapped at the sixth switching element 102 to output 2.

Figure 3B:
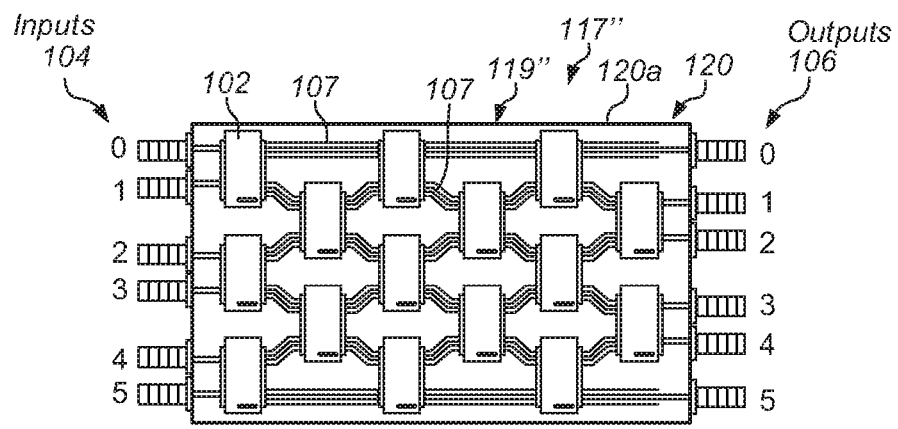
FIG. 3B is a diagram that illustrates a J-Type matrix switch system in accordance with one or more embodiments.
Figure 3C:
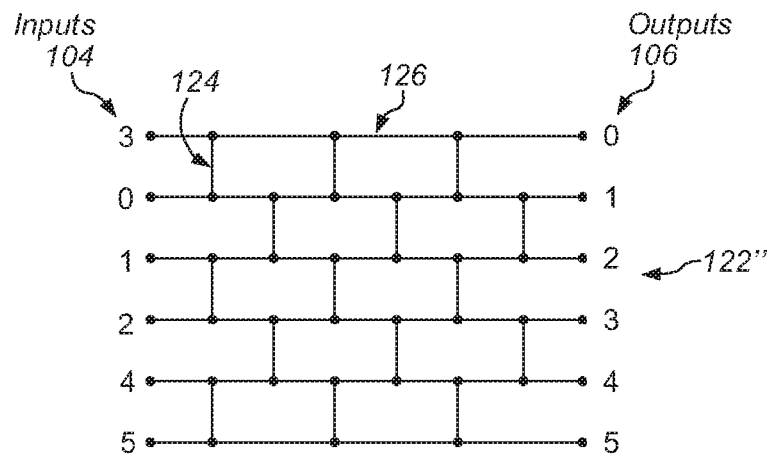
FIG. 3C is a sorting network notation model corresponding to the J-Type matrix switch topology of FIGS. 3A and 3B, in accordance with one or more embodiments.

FIG. 3B is a diagram that illustrates a 6×6 J-Type matrix switch system 117" in accordance with one or more embodiments. The 6×6 J-Type matrix switch system 117" implements a switch matrix 119" (corresponding to switch matrix 101") provided on PWB 120. Switch system 117" includes switching elements 102, inputs 104, outputs 106, and interconnects 107. Switch system 117" may include features that are similar to that of switch system 117 described above. For example, interconnects may be disposed on faces or within layers of PWB 120. FIG. 3C is a sorting network notation model 122" corresponding to the 6×6 J-Type matrix switch topology 100" of FIGS. 3A and 3B, in accordance with one or more embodiments of the present technique.

In some embodiments, all paths through switch matrix 101" and/or 119" may have substantially the same or identical electrical length and time delay. As described in more detail below, various 2×2 switching elements 102 may provide substantially stub-less contiguous paths (e.g., paths without conductive ends off-shooting into a dead-ends) in either states of the switching elements 102, thereby reducing stubbed paths within switch matrix 101" and providing a relatively stub-less signal path though switch matrix 101" and topology 100". Some or all of 2×2 switching elements 102 may be other types of switching elements, such as 1×2 switching elements (SPDTs), 1×4 switching elements, 4×4 switching elements, 8×8 switching elements, and so forth. Pairs/sets of signals may be routed in a substantially similar manner by employing, at each of the switching element locations 102, larger dimension switching elements (e.g., 4×4 and 8×8) and/or multiple 2×2 switching elements to effectively provide functionality of larger dimensioned switching elements (e.g., multi-wire signal routing).

Figure 4:
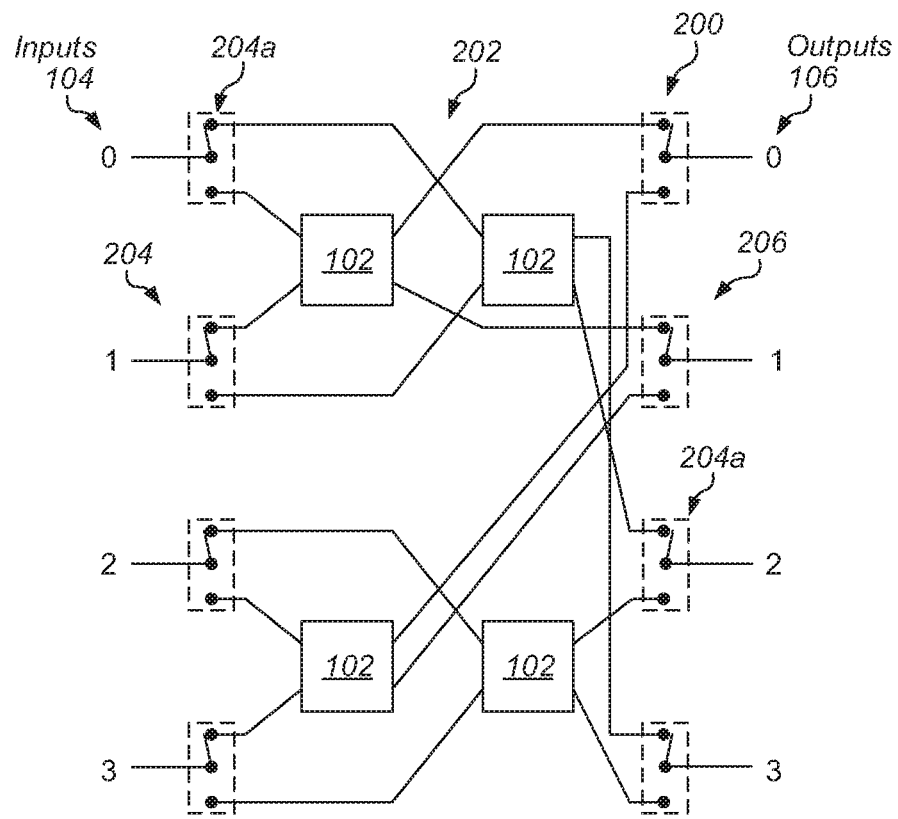
FIG. 4 is a schematic diagram that illustrates a multiplexer-matrix-multiplexer (Mux-Mat-Mux) switch topology in accordance with one or more embodiments.

FIG. 4 is a schematic diagram that illustrates a multiplexer-matrix-multiplexer (Mux-Mat-Mux) switch topology 200 in accordance with one or more embodiments. In the illustrated embodiment, Mux-Mat-Mux switch topology 200 includes a 4×4 switch matrix that includes a first set of multiplexers 204 coupled to inputs 104, a second set of multiplexers 206 coupled to outputs 106, and matrix 202 including four 2×2 switching elements 102. In some embodiments, each path includes a unique pathway. That is, there may only be one possible path to route a signal from a given input to a given output. For example, a signal routed from input 0 to output 2 may be routed though multiplexer 204a to the upper node as depicted, to a first input of a switching element 102 coupled to the upper node, the signal may be routed to a second output of given switching element 102 (e.g., swapped), and routed to output 2 via the upper node of multiplexer 206a, as depicted. Similar unique pathways may be provided for each combination of inputs 104 (0-3) and outputs 106 (0-3).

Other embodiments may include other size matrices, including, for example, a 6×6 switch matrix, a 4×8 rectangular switch matrix, a 4×16 rectangular switch matrix, or the like. Although depicted matrix 202 includes a 4×4 set of switching elements 102, matrix 202 may include other numbers of switching elements to provide desired signal connectivity/routing. For example, matrix 202 may include an 8×8 set of switching elements 102. Although depicted multiplexers 204 include 1×2 multiplexers, any size multiplexer may be used to provide desired signal connectivity/routing. Some or all of 2×2 switching elements 102 may be other types of switching elements, such as 4×4 switching elements, 8×8 switching elements, and so forth. Pairs/sets of signals may be routed in a substantially similar manner by employing, at each of the switching element locations 102, larger dimension switching elements (e.g., 4×4 and 8×8) and/or multiple 2×2 switching elements to effectively provide functionality of larger dimensioned switching elements (e.g., multi-wire signal routing). In various embodiments, multiplexers 204 may be implemented as one of the disclosed switching elements as a microwave switch inside a PWB.

In some embodiments, a switch matrix topology and/or a switch system employing 2×2 switching elements may be modeled as a sorting matrix/network. For example, a switch matrix may be modeled using network notation representations. A switch matrix topology may be modeled based on of a sorting network layout during design of a switch to determine a minimum number of switching elements required and the corresponding layout of interconnects to provide for desired switch routing. For example, a switch modeled after a sorting network may provide paths for the simultaneous routing of any set of inputs to any set of respective outputs. Further, using the sorting matrix model, sorting algorithms/routines may be executed to determine how paths should be routed to provide a desired connection between inputs and outputs during use.

As discussed above, FIG. 2C is a sorting network notation model 122' in accordance with one or more embodiments of the present technique. Sorting network notation model 122' includes connectors 124 (e.g., vertical lines), each corresponding to a two-input sorting element (e.g., a comparator) of the sorting network, and wires 126 (e.g., horizontal lines)

corresponding to paths between the comparators. The wires terminate into input terminals for providing/inputting an "unsorted" listing of sortable elements and terminate on opposite ends into output terminals for providing/outputting a "sorted" listing of the sortable elements. Sorting may occur upon the application of a sorting algorithm that corresponds to the network sorting model. The two-input sorting element or comparator may provide a compare-exchange operation with respect to the two inputs received thereby. With regard to a switch matrix implementing 2×2 switching elements, connectors 124 may correspond to switching elements 102, and wires 126 may correspond to interconnects 107 (e.g., paths/traces) between the 2×2 switching elements. Sorting network notation model 122' may correspond to the 4×4 switch matrix topology 100' of FIG. 2A and matrix switch system 117' of FIG. 2B. For example, in the illustrated embodiment, each connector (vertical edges 124a-124e) represents a respective one of switching elements 102a-102e. Note, the wires (horizontal lines/edges) of model 122' do not necessarily correspond to a continuous trace/interconnect on PWB 120 of matrix switch system 117'. In some embodiments, network sorting techniques, modeling of a switch using sorting network notation, and operations relating thereto may be provided via a network sorting module provided on a computer, such as computer system 2500 discussed below.

When implemented, the sorting network may sort storable elements provided at inputs to a sequential order (e.g., ascending or descending order) provided at the outputs. For example, by network sorting convention, each element may sort the outputs to a sequential order (e.g., ascending order with the largest number going to the bottom), as represented by outputs 106 listed as 0, 1, 2, and 3 from top to bottom of model 122'. Inputs 104 may include an arbitrary set of channel numbers, as represented by inputs 104 labeled as 3, 0, 1, and 2 from top to bottom of model 122', indicating the destination for each respective input. For example, the first/top input (labeled 3) is to be routed to output 3, the second input (labeled as 0) is to be routed to output 0, the third input (labeled as 1) is to be routed to output 1 and the fourth input (labeled as 2) is to be routed to output 2. The numbers listed at the ends of each vertical edge are indicative of how an element to be sorted (e.g., a number) theoretically winds its way through the sorting network from an input to an output. Notably, the path through the sorting network may resemble the path of a signal as it passes through a switch having traces and 2×2 switching elements that correspond to the lines and connectors of the sorting network model.

Based on the ability to track the path of an input element (e.g., number) from an input to a sorted output, sorting may be used to determine a state of each comparator, and thus the state of each 2×2 switching element of the corresponding to switch matrix topology to achieve a routing of signals that follows the same path as the routing of elements being sorted. For example, where a user desires to route the first input to the last/fourth output (labeled 3), the user may associate the number "3" with (e.g., place the number "3" at) the first input along with the numbers "0", "1" and "2" at the other inputs, knowing that the sorting network will generate a path from the first input to the last/fourth output. That is, where a user desires to route a signal from a given input to a given output, the user may simply provide a sortable element (e.g., a number, letter, symbol, etc.) indicative of the last output at the given input of the network sorting model, and implement a sorting routine which will direct the element to the desired output and observe the path of the element through the sorting network model from the input to the output. The observed path corresponds to a signal path through the switch matrix. Thus, where the path crosses through a connector, the switching element corresponding to the connector may be provided in the swapped state, and where the path does not cross through the connector, the switching element corresponding to the connector may be provided in a pass-through/un-swapped state such that the signal is not swapped at that respective switching element.

As observed with regard to the bolded element path 128 in model 122' of FIG. 2C, the element labeled as 3 is input to a first line 126 (as indicated by the input label "3"), crosses through connector 124a to a second line 124 (as indicated by swapped positions of "0" and "3" at nodes of connector 124a), is directed on second line 124a to connector 124d, crosses through connector 124d to a fourth line 126 (as indicated by swapped positions of "2" and "3" at nodes of connector 124d) and is directed to the last output (as indicated by the output label "3"). Based on the sorting and the path for element "3", switching element 102a (corresponding to connector 124a) may be operated in a state to swap signals and switching element 102d (corresponding to connector 124d) may be operated in a state to swap signals. As depicted, similar sorting may be provided for each element input to the sorting network model 122', thereby providing observable paths between each of the inputs and the outputs corresponding to the elements provided at each input. Thus, the state of each of the 2×2 switching elements may be determined based on the states of the corresponding connectors of the sorting network model observed as a result of the sort. For example, switching element 102b may be operated to pass signals straight-through (as indicated by the non-swapped positions of "0" and "1" at nodes of connector 124b), switching element 102c may be operated to pass signals straight through (as indicated by the non-swapped positions of "1" and "2" at nodes of connector 124c), and switching element 102e may be operated to swap signals (as indicated by the swapped positions of "1" and "2" at nodes of connector 124e). With the switching elements of switching topology 100' and switch system 117' set to these states, signals may be routed such that input 0 is connected to output 3, input 1 is connected to output 0, input 2 is connected to output 1, and input 3 is connected to output 2. Thus, a routing technique includes providing/identifying a sorting network model that corresponds to the layout of a switch matrix, providing—for each input—an indication of a desired output location, implement a sorting routine using the sorting network model, identifying/determining the resulting conditions of the connectors/comparators of the sorting network, and configuring the switching elements of the switch matrix into states that correspond to the identified/determined conditions of the connectors/comparators.

Figure 5:
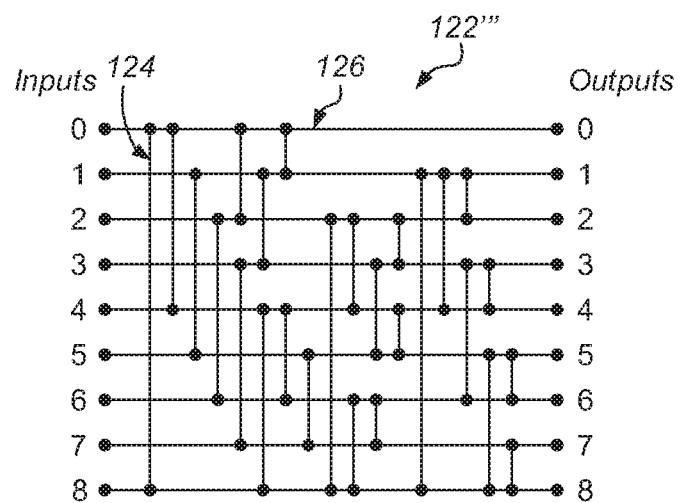
FIG. 5 is a network notation model of a 9×9 switch matrix topology in accordance with one or more embodiments.

Although the above embodiments relate to a network model of a 4×4 matrix and techniques related thereto, other embodiments may include matrices of various sizes and configurations. For example, similar techniques may be employed for various sizes of switches having cylindrical matrix topologies and J-type matrix switch topologies, such as those described with respect to FIGS. 1A-1D and 3A-C. Further, various forms of network sorting models may be used to design switch topologies. For example, FIG. 5 is a network notation model 122''' of a 9×9 switch matrix topology in accordance with one or more embodiments of the present technique. In some embodiments, a matrix switch may be designed and implemented that includes corresponding inputs and outputs coupled via interconnects and 2×2 switching elements that correspond to each of the depicted connectors 124. Embodiments may employ any form of sortable element (e.g., a number, letter, symbol, etc.) that can be sorted in a predictable order (e.g., an ascending or descending order). Other embodiments may include implementing models and methods provided by various network sorting techniques. For example, a switch may correspond to network sorting topologies including, but not limited to, Bose-Nelson sort, Hibbard sort, Batcher sort, END sort, Insertion sort, Bitonic sort, Odd-Even Merge sort, Shell sort, Transposition Sort, Pairwise sort, Bubble sort, Selection sort, or any combination thereof.

Figure 6:
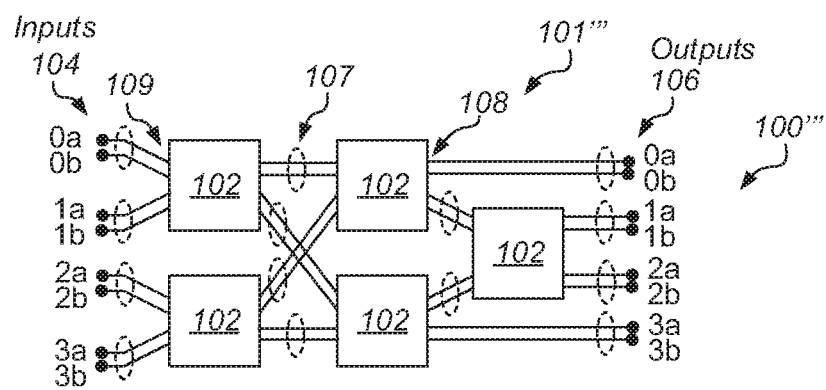
FIG. 6 is a schematic diagram that illustrates a multi-wire switch matrix in accordance with one or more embodiments.

FIG. 6 is a schematic diagram that illustrates a multi-wire switch matrix topology 100''' in accordance with one or more embodiments. In the illustrated embodiment, matrix topology 101''' includes eight inputs 104 and eight outputs 106, but is logically still a 4×4 switch matrix. Each of switching elements 102 includes four inputs and four outputs, but is logically still a 2×2 switching element. In some embodiments, each pair of inputs is always routed together for functional reasons (e.g., they represent the positive and negative polarity of an electrical signal). During use, each of switching elements 102 may route pairs of signals straight through, or may swap the pairs of signals. Thus, in some embodiments, switching elements 102 of switch matrix topology 101''' may be operated such that pairs of inputs may be routed to corresponding pairs of outputs, during use. The routes/paths of each signal of the pairs signals may be the same or substantially similar. For example, a pair of signals provided to a respective pair of inputs (0$a$, 0$b$) may be each be routed straight through the first switching element, swap paths at the second switching element, and be routed straight through the third switching element, such that both of the pair of signals are routed to the pair of outputs (1$a$, 1$b$) via substantially the same route.

In the illustrated embodiment, topology 100''' includes a multi-wire A-Type topology similar to that of A-type matrix topology 100' described with respect to FIGS. 2A-2C. Notably, such a multi-wire topology may essentially include two or more topologies "superimposed" upon one another. For example, two 2×2 switching elements may be provided at each location of switching elements 102 to provide the 2-wire switching element functionality of topology 100'''. Similar techniques may be employed for each of the switch topologies (e.g., cylindrical, J-Type, Mux-Mat-Mux, etc.) described herein. For example, a two-wire or eight-wire cylindrical matrix switch topology may be provided by implementing respective 2-wire or 8-wire switching elements at each of the locations of switching elements 102, and providing corresponding conductive paths there between.

Notably, the multi-wire switch matrices may be modeled as a network sorting notation model, manufactured, and employed in a manner similar to that described above. For example, a sorting network notation model may be applied to the topology 100''' in a manner similar to that described above with respect to topology 100' and associated methods described above with respect to at least FIGS. 2A-C.

In the illustrated embodiment, topology 100'''' includes an A-Type matrix topology similar to that of A-type matrix topology 100' described with respect to FIGS. 2A-2C but with increased channel count. Notably, such an expanded topology may essentially include two or more topologies nested within one another. For example, any topology of 8×8 matrix may be provided at each location of switching elements 102 to provide the 16×16 switching functionality of topology 100''''. Similar techniques may be employed for each of the switch topologies (e.g., cylindrical, J-Type, Mux-Mat-Mux, etc.) described herein. For example, a 16×16 cylindrical matrix switch topology may be provided by implementing respective 8×8 switching elements at each of the locations of switching elements 102, and providing corresponding conductive paths there between.

Figure 7:
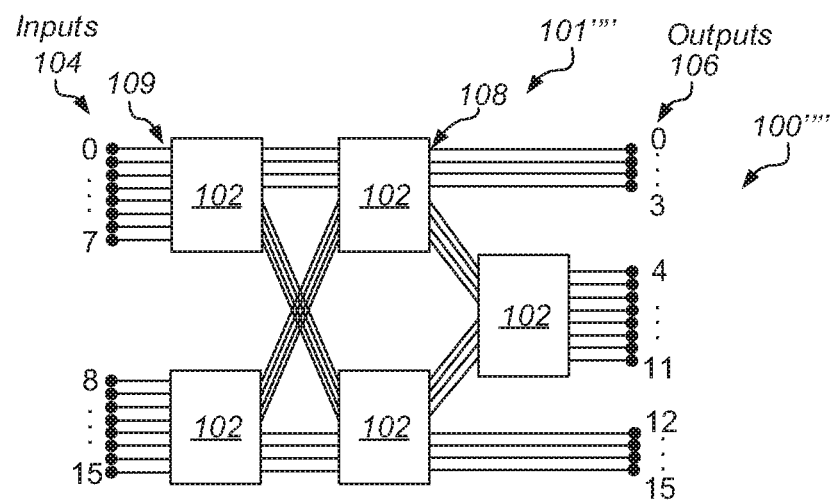
FIG. 7 is a schematic diagram that illustrates a switch matrix including 8×8 switching elements in accordance with one or more embodiments.

Although several of the embodiments herein have been described with respect to switch matrices including 2×2 switching elements, other embodiments may employ the same or similar topologies to route an increasing number of signals using different numbers and types of switching elements. For example, one or more multi-dimensional (e.g., 4×4, 8×8, . . . n×n) switching elements may be used to route an increasing number of signals. FIG. 7 is a schematic diagram that illustrates a switch matrix including 8×8 switching elements in accordance with one or more embodiments of the present technique. In the illustrated embodiment, matrix topology 101'''' includes sixteen inputs 104 and sixteen outputs 106. Each of switching elements 102 includes eight inputs and eight outputs (e.g., an 8×8 switching element) and is functionally an independent 8×8 switch matrix or sorting network. During use, each of switching elements 102 may route any of its input signals to any of its output signals. For example, in FIG. 7, half of the inputs (0, 1, 2, 3, 4, 5, 6, 7) may be applied to the first switching element which will sort them into descending order. The lesser valued (upper) four of those sorted signals will pass on to the second switching element and be combined with the lesser valued (upper) four signals from the other half of the inputs (8, 9, 10, 11, 12, 13, 14, 15). The second switching element will re-sort those eight combined signals and pass the lesser valued four to the upper four outputs (0, 1, 2, 3), which are now clearly the lesser four of all sixteen inputs, and in correct descending order. Notably, the overall sorting topology is the same as that shown in FIG. 2A, but more signals are passed between switch elements.

Switching elements the same or similar to those described above may be employed in a variety of schemes to provide for routing of signals. In some embodiments, for example, 2×2 switching elements may be employed in conjunction with multiplexers to provide a switch having desired signal connectivity/routing. One type of switching element that may be used in the described topologies includes microwave switches that are at least partially implemented in a PWB and may be referred to as MacroMEMS. Various example MacroMEMS switches are described below at FIGS. 8-24. Although the switches below are described as being partially implemented in a PWB, the switching structures and techniques described herein apply to similar laminated materials as well.

Figure 8:
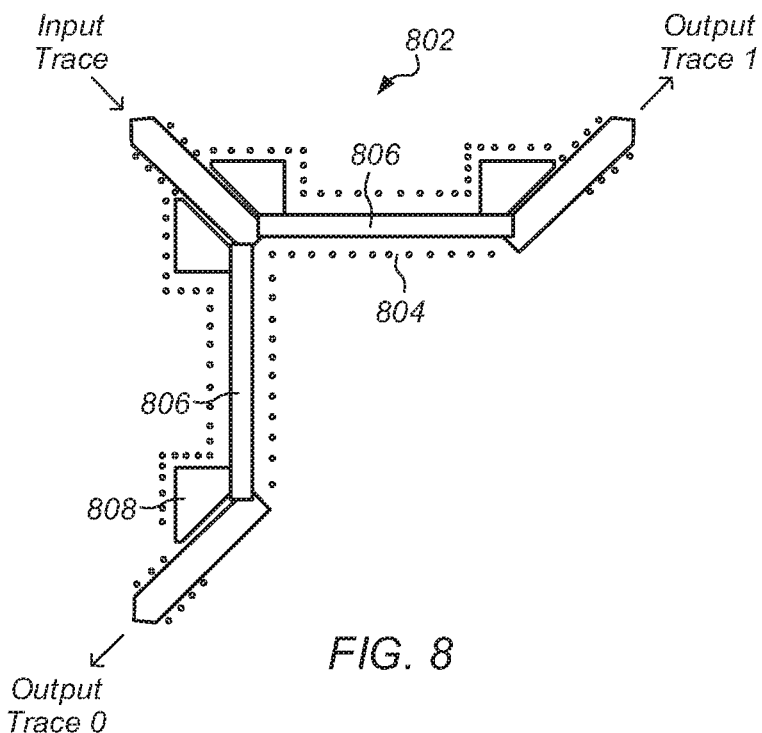
FIGS. 8-11 illustrate various example switching elements, according to some embodiments.

FIGS. 8-11 illustrate various example switching elements. Turning to FIG. 8, a top view of an SPDT switching element 102 is shown. As shown, switching element 802 may include an input trace and two output traces. Between each of the output traces and the input trace is a respective contact 806. Each contact 806 may be operable to couple the input to a respective one of the outputs. Thus, the leftmost contact 806 may be operable to couple the input trace to output trace 0 whereas the rightmost contact 806 may be operable to couple the input trace to output trace 1. The inputs and outputs may be referred to as "stationary contacts" and the plurality of contacts may be referred to as "operable" or "moving" contacts. As used herein, use of "plurality of contacts" or "contact by itself" without the term "stationary" refers to the operable or moving contacts. As illustrated at 804, the air pocket may form a waveguide below cutoff. Accordingly, the switch mechanism may separate the stationary contacts with a shielded enclosure that surrounds the moving contacts. Air or another dielectric within the shielded enclosure forms a waveguide. In some embodiments, the waveguide may only conduct RF energy above its cutoff frequency. Below cutoff, RF energy may be attenuated. The width of the waveguide may be chosen for a cutoff frequency that is well above the desired operating frequency of the switch. The length of the waveguide may be chosen to provide adequate attenuation. Such use of a waveguide-below-cutoff structure may maximize off-state isolation at RF or microwave (or other) frequencies. It may further allow the moving contacts to be grounded when off.

In one embodiment, the contacts may be made of and/or include a magnetic metal or alloy. The magnetic alloy may allow the contact bar to be actuated by an externally applied magnetic field. One example magnetic alloy may be Kovar. In some embodiments, the contacts may include an outer coating of a precious metal (e.g., gold). In the embodiment shown, each of the contacts 806 may be a gold plated Kovar contact bar. Using a magnetic alloy for the contact bars may allow the contact bars to be etched with tighter tolerances than an inserted mechanical part. In one embodiment, as described herein, the contact bars may be actuated by a magnetic field (e.g., via magnet, solenoid, coil, etc.). Because they are actuated by magnetic fields, there may not be a need to penetrate the shielding structure with a dielectric actuator arm that may degrade isolation. In other embodiments, the contact bars may not be made of a magnetic alloy and may be actuated in a different manner, such as by a separate mechanism that uses magnetic, piezoelectric, bimetal thermal, or electrostatic methods. Such a separate actuator may be integrated into the one or more PWBs along with other components of the switch, or it may be external to but mounted on the one or more PWBs (e.g., as in the solenoid example described below).

Hinges 808 may be configured to provide mechanical stability between a respective one of the contacts, the input trace, and the corresponding output trace. Hinges may be made of a durable material (e.g., Kapton) capable of handling a large number of cycles (e.g., millions of cycles). The hinges may be non-conductive (e.g., Kapton) in the case of rigid-flex PWB assemblies, teflon, piezoelectric ceramic, etc. In one embodiment, hinges 808 may be fabricated using flex or rigid-flex PWB techniques. The hinges may not be required to apply actuation forces or spring tension in various embodiments. One example material that may be used for the hinges is Kapton. In other embodiments, the hinges may apply actuation forces or spring tension. In one embodiment, a hinge 808 may be provided at each of the distal and proximal end of each contact. Such location may provide for location control. Moreover, the center of the contact bars may be available for the waveguide below cutoff 804, which may further provide improved isolation.

Not explicitly shown in FIG. 8 but which may be more readily apparent in some of FIGS. 9-24, the switching element may be at least partially implemented in one or more PWBs. In an embodiment with multiple PWBs (e.g., a sandwich of PWBs), the one or more PWBs may refer to different PWBs or it may refer to different layers within a single PWB. In some embodiments, input and output traces (stationary contacts) may be integrated into the one or more PWBs. In such embodiments, the stationary contacts may be integrated into the transmission line structure of the PWB to help minimize RF signal distortion and for ease of interconnect to other switches and/or circuitry. Such integration may also offer size and cost reduction. In one embodiment, contacts 806 and/or hinges 808 may also be integrated into the one or more PWBs. In other embodiments, contacts 806 may be a mechanism external to the PWB(s). The various described implementations using one or more PWBs may reduce or eliminate the need for relays within a switching element and between switching elements in the topologies described herein.

The description at FIG. 8 of the PWBs, air pocket and waveguide below cutoff, contacts, and hinges may be similar for the various embodiments of switching elements of FIGS. 9-24 and therefore, the discussion of those Figures may not be in as much detail as was the description of FIG. 8. Moreover, the description of common features among FIGS. 8-24 may not be described with respect to each of those Figures.

Switching element 802 may be operable between different states to provide for the routing of signals through the switching element in different ways. In the example of FIG. 8 for a SPDT switching element, the switching element may be selectively operable (e.g., magnetically operable) in a first state, a second state, and an off state. In the first switching state, switching element 802 may route a first input to a first output (e.g., output trace 0). In the second switching state, switching element 802 may route the first input to the second output (e.g., output trace 1). In the off switching state, neither route (first input to first output or first input to second output) may be active. One or more commands/signals may be provided to switching element 802 to set the state of switching element 802.

Figure 9:
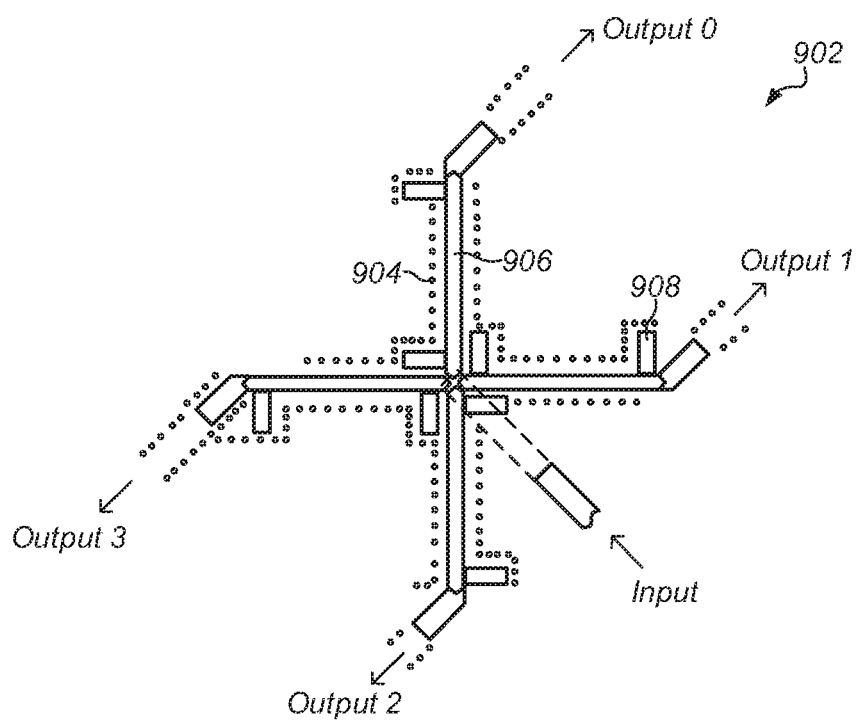

FIG. 9 illustrates an example 4×1 multiplexer switching element 902. The illustrated embodiment, of FIG. 9 is similar to that of FIG. 8 with an additional 2 outputs. Moreover, the layout in FIG. 9 is not in a basic Form-C design, as in FIG. 8, but instead is in a star configuration. Note that the various switching elements of FIGS. 8-24 may exist in various configurations and are not limited to star and Form-C. A configuration may be based on the number of inputs and outputs of the switching element. Referring again to FIG. 9, switching element includes an air pocket and waveguide below cutoff 904, contacts 906, and hinges 908, as described at FIG. 8. Switching element 902 may also be operable between different states to provide for routing of signals through the switching element in different ways. For example, first, second, and off states may be similar to those described at FIG. 8. Additionally, switching element 902 may be selectively operable in a third state and a fourth state. In the third switching state, switching element 902 may route a first input to a third output (e.g., output 2). In the fourth switching state, switching element 902 may route the first input to the fourth output (e.g., output 3).

Figure 10:
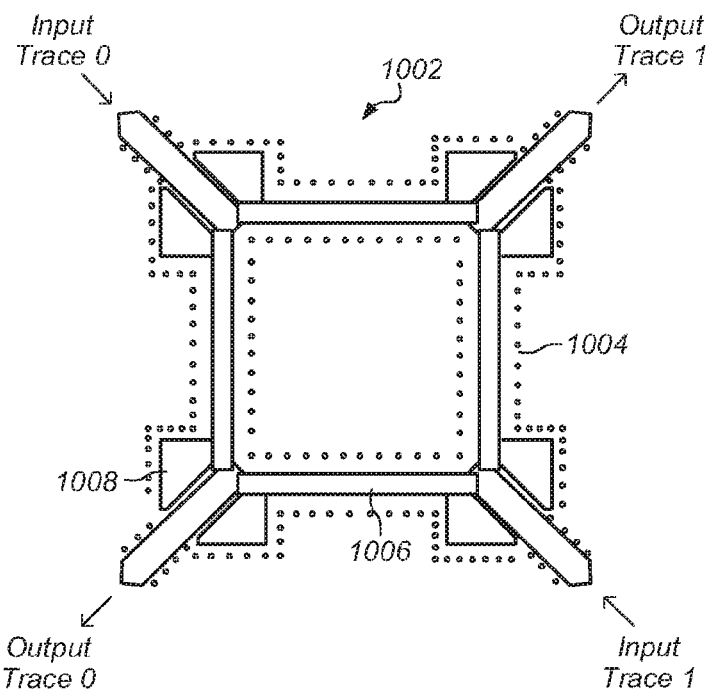
Figure 11:
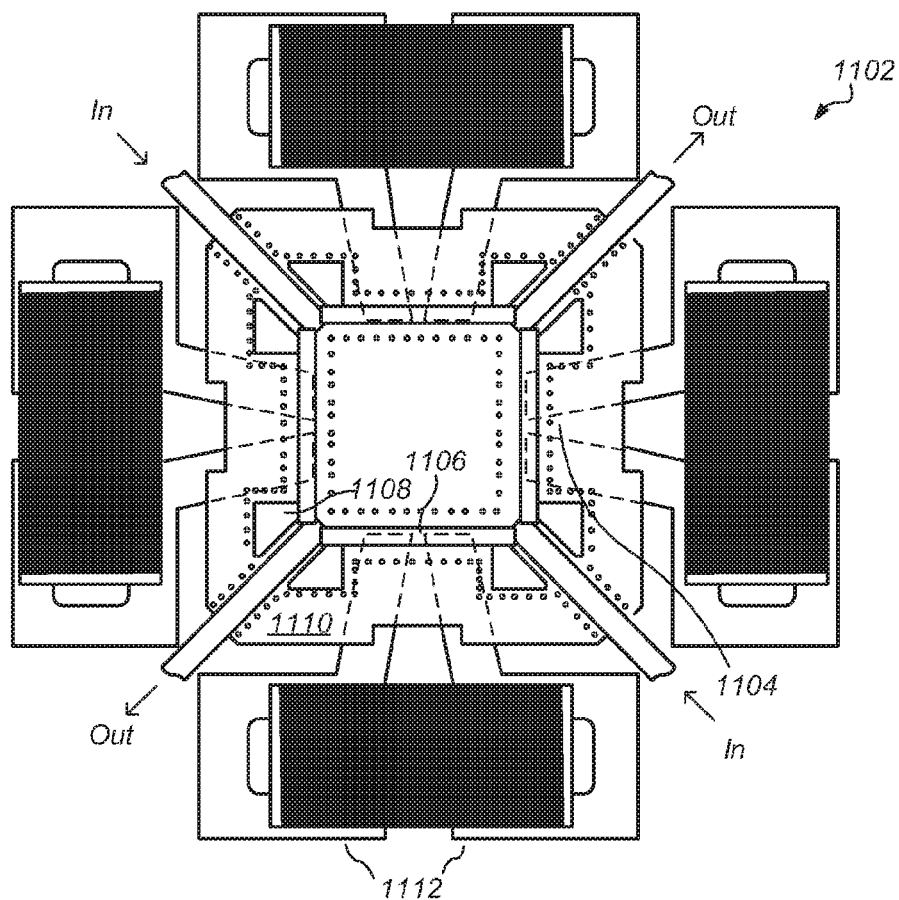

FIGS. 10 and 11 illustrate an example 2×2 switching element 1002. The illustrated example is similar to that of FIG. 8 with an additional input. Switching element 1002 may be selectively operable in first, second, and off states as described at FIG. 8. Additionally, switching element 1002 may be operable in third and fourth states. In the third switching state, switching element 902 may route a second input (e.g., input trace 1) to the first output (e.g., output trace 0). In the fourth switching state, switching element 902 may route the second input to the second output (e.g., output trace 1).

FIG. 11 illustrates more detail of an example 2×2 switching element 1102. Specifically, spacer layer 1110 is shown that is more easily shown in the cross-section diagrams illustrated below. The spacer layer may be a separate PWB or PWB layer of the one or more PWBs. Magnetic actuator 1112 is shown in FIG. 11 as etched Kovar pole pieces. Etched Kovar may be used to form the magnetic pole pieces that actuate, or pull down, a respective contact bar when in operation. Using such pole pieces may allow the relatively larger coils to be moved outside of the contact structure. During operation, Kovar may conduct the flux to the appropriate location for actuation. Note that in other embodiments, the actuator may not be on an adjacent side of the switch but rather may be located on top and/or below the topmost or bottommost PWB, as will be more easily shown in the below described cross section views. And still in other embodiments, the actuator may not be a magnetic actuator to conduct flux and instead may be a push-type or piezoelectric actuator. As shown, each contact bar may have a corresponding magnetic actuator such that each is individually selectable to actuate.

Figure 26:
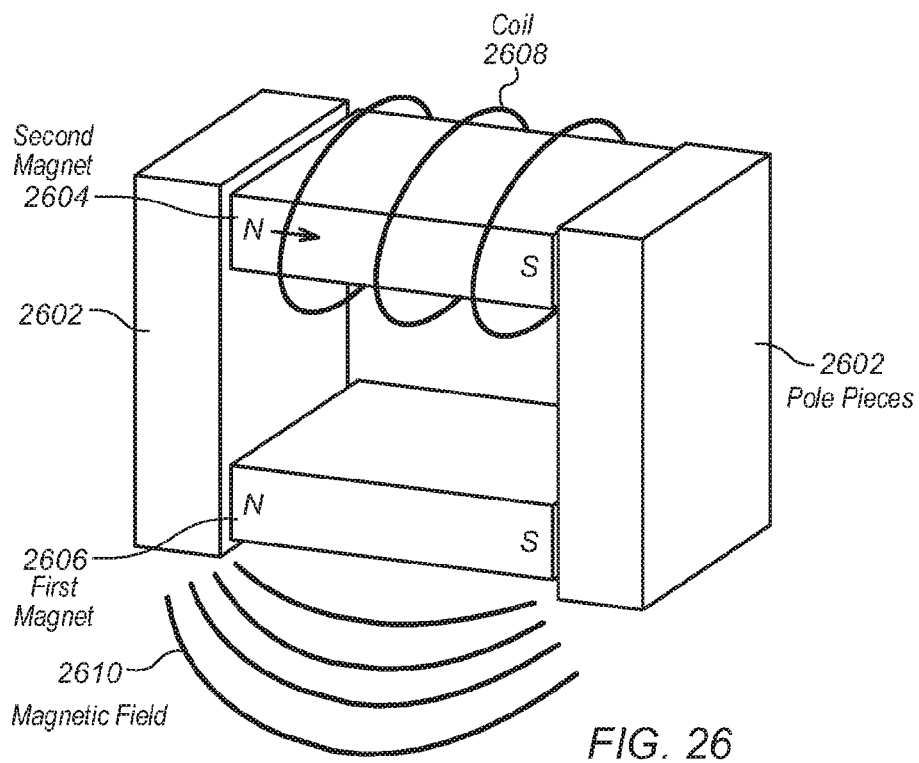
FIGS. 26-27 illustrate an example electropermanent magnet assembly in accordance with one or more embodiments.
Figure 27:
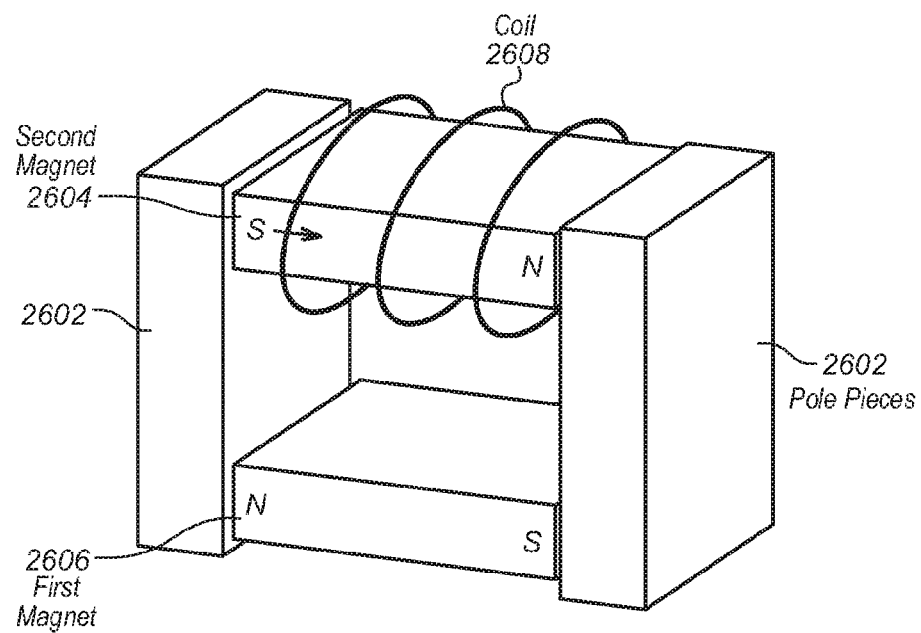

The magnetic actuator may comprise an electropermanent magnet assembly. FIG. 26 illustrates an example electropermanent magnet assembly. An electropermanent magnet assembly may include a plurality of (e.g., two) different types of permanent magnets. The different types of permanent magnets may be suspended between two or more pole pieces 2602 of permeable metal (e.g., steel). In some embodiments, one of the permanent magnets (illustrated in FIG. 26 as second magnet 2604) may have a high coercivity (i.e., resistance to being demagnetized or remagnetized). For example, a permanent magnet with a high coercivity may include a Neodymium-Iron-Boron magnet. Another of the different types of permanent magnet (e.g., other than a permanent magnet with a high coercivity, illustrated in FIG. 26 as first magnet 2606) may have a low coercivity. For example, a permanent magnet with a low coercivity may include an Alnico magnet (e.g., Alnico 5). Coil 2608 may be wrapped around both magnets and/or around the permanent magnet with a low coercivity (e.g., an Alnico 5 magnet) such that current that flows through the coil (e.g., a pulse of current in a coil around an Alnico 5 magnet) can be used to reverse the poles of the low coercivity magnet. In response to the current, the orientation of the poles of the two magnets may reinforce each other (e.g., the magnetic poles of the permanent magnets may be oriented in substantially the same direction), thereby turning the electropermanent magnet assembly to an "on" state. FIG. 26 illustrates magnetic field 2610 that may result from the electropermanent magnet assembly in an "on" state. Similarly, running current through the coil may cause the orientation of the poles of the two magnets to oppose or cancel each other (e.g., the magnetic moment of one permanent magnet may be substantially oriented in the opposite direction of the magnetic moment of the other permanent magnet), thereby turning the electropermanent magnet assembly to an "off" state. FIG. 27 illustrates an electropermanent magnet assembly in an "off" state. Note that the electropermanent magnet assembly in the "on" state may create a very strong magnetic field but does not require continuous power to be applied.

The contact bar may include tips that may be aligned with the pole faces of the magnetic actuator. As previously noted, the contact bar may be made of and/or include a magnetic metal or alloy (note that use of the word "metal" includes "pure" metal, substantially pure metal, and metal alloys). The contact bar may be made of and/or include two or more metals. In some embodiments, one of the two or more metals may be attracted by the magnetic actuator. The other metal may be non-magnetic and may be used to extend the electrical contact points of the contact bar farther apart (e.g., the ends/tips of the contact bar may be made of a first metal that is magnetic and the portion of the contact bar between the ends/tips may be made of a second metal that is non-magnetic). This configuration may provide for more space between the magnetic actuators and may prevent and/or mitigate the extent to which the magnetic actuators interfere with each other (e.g., mechanically and/or magnetically). In some embodiments, the contact bar may have the electrical contacts mounted on one or more extensions (e.g., the extensions may be made of and/or include a spring and/or a dielectric material). Mounting the electrical contacts on extensions may reduce the mass of the contact points and may thus reduce the impact force at contact closure, thereby extending the useful life of the contacts. In some embodiments, the contact bar pocket may be filled with a suitable fluid (e.g., lubricating oil) to provide viscous damping of the contact bar. This fluid may reduce the velocity at which the contact bar moves at contact closure and thus may reduce the impact force at contact closure.

In various embodiments, as described at FIGS. 8-10, only one (or none) contact may be actuated at a time such that only one path is active at a time. In other embodiments, multiple paths may be actuated at a time. For example, the contact between the first input and first output may be actuated to couple the first input to the first output while the contact between the second input and second output may be actuated to couple the second input to the second output. Typically, however, multiple outputs may not be coupled together and multiple inputs may not be coupled together. Thus, in the example SPDT of FIG. 8, the first input may not be coupled to both outputs at the same time. Switching element 102 may selectively route signals directly (e.g., "straight-through") to two corresponding outputs, or may route the signal such that the signals trade (e.g., "swap") paths such that the swapped signals are output on the other of the two outputs. Thus, at each 2×2 switching element 102, a signal may proceed straight through, or it may trade/swap places with its neighbor, thereby enabling the signal to wind its way through switch matrix 101 from one of inputs 104 to one of outputs 106. As discussed in more detail below, although the paths are discussed with regard to inputs and outputs to provide clarity and consistency with regard to input/output (I/O) paths/terminals labeled as inputs (e.g., inputs 104) and outputs (e.g., outputs 106), in some embodiments, the resulting conductive path may be used to route signals in either direction (e.g., from outputs to inputs of from inputs to outputs).

Figure 12:
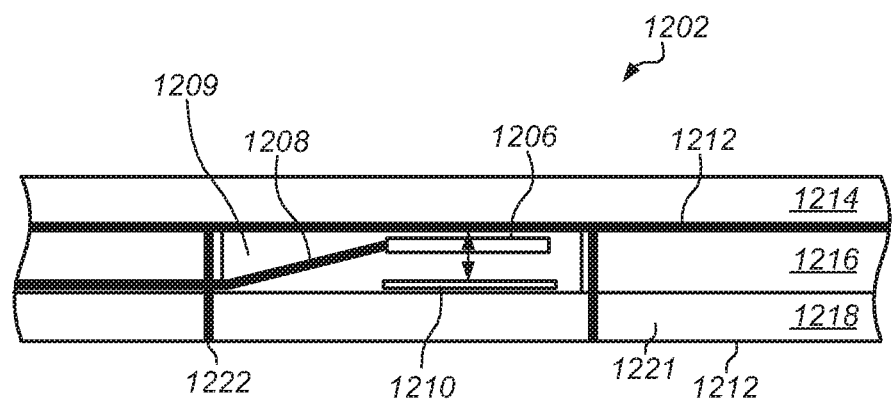
FIGS. 12-17 illustrate cross-section diagrams of example switching elements, according to various embodiments.

Turning now to FIGS. 12-17, cross-section diagrams of various example switching elements are shown. FIG. 12 illustrates a cross section, end view of switching element 1202 in an off state. The arrow shows that the contact 1206 may be actuated to make contact with input/output trace 1210. When contact 1206 is actuated to make contact with input/output trace 1210, hinge 1208 may likewise be operable to facilitate such contact. The illustrated embodiment includes three PWBs, or PWB layers. PWB 1214 is a support layer, PWB 1216 is a spacer layer, and PWB 1218 includes RF dielectric 1221 and may be referred to as the motherboard. Air pocket 1209 is illustrated in the area between hinge 1208 and support layer 1214. Also shown are ground planes 1212, which may be connected by vias 1222. Ground planes 1212 may, in some embodiments, be plated, for example with gold.

Figure 13:
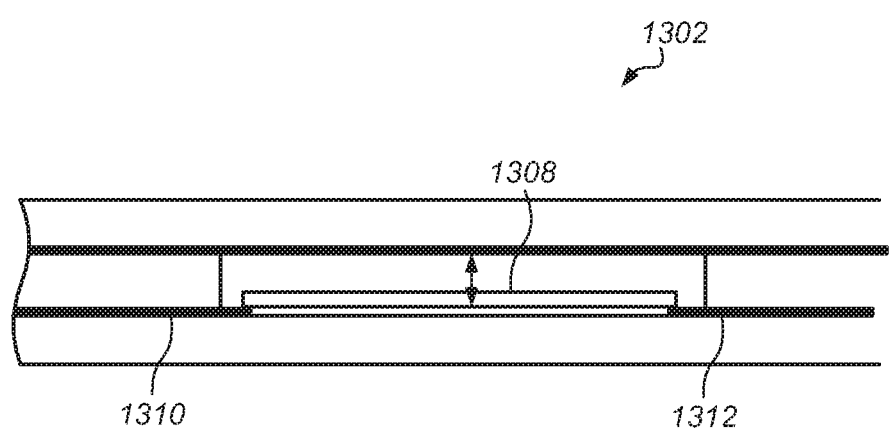

FIG. 13 illustrates a cross section, side view of switching element 1302 shown in an on state (e.g., first, second, third, or fourth state, as described above). As shown, in an on state, the contact bar 1308 may be coupled to an input trace 1310 and an output trace 1312, which may allow a signal input to the input 1310 to be routed via a path from input 1310 to output 1312.

Figure 14:
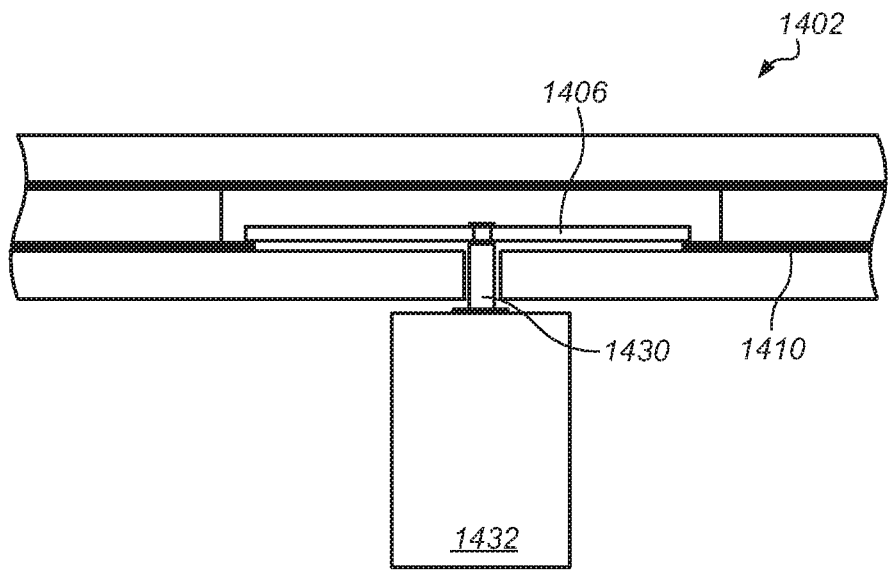

FIG. 14 is a cross section, side view of a switching element 1402 shown in an on state. As shown, switching element is actuated via pushrod. Solenoid 1432 may be configured to cause pushrod 1430 to actuate contact bar 1406 such that an input is coupled to output trace 1410.

Figure 15:
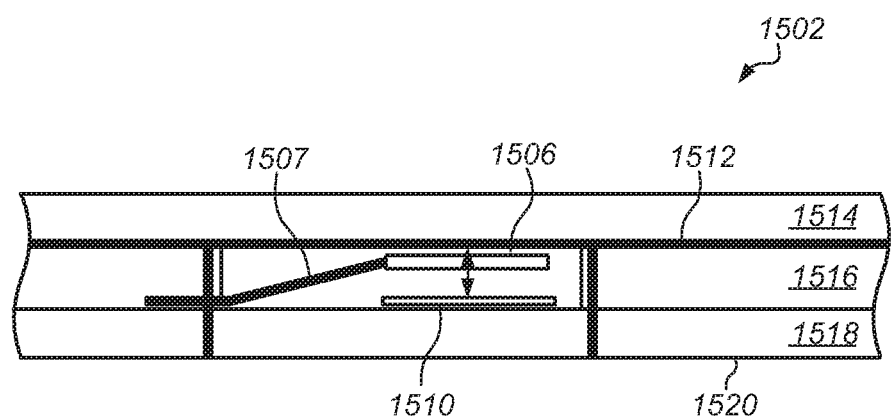

FIG. 15 is a cross section, end view of a switching element 1502 shown in an off state that uses piezoelectric actuation. As shown, piezoelectric bending beam actuator 1507 may be configured to actuate contact bar 1506 to make contact with input/output trace 1510, and also functions as the hinge. Similarly numbered elements may represent similar features across different figures (e.g., support layer 1214 is akin to support layer 1514) unless indicated otherwise.

Figure 16:
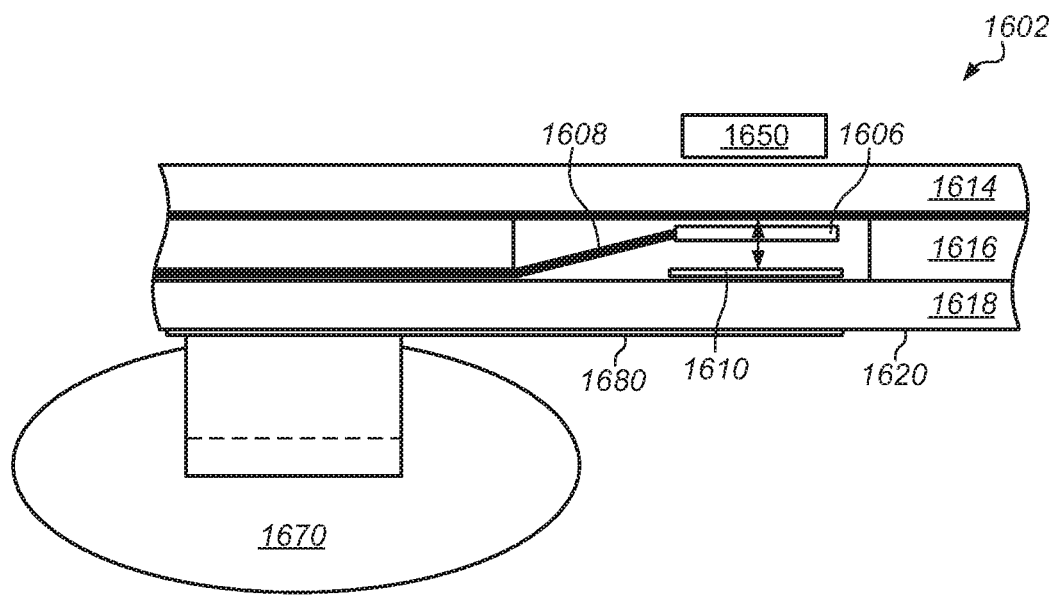

FIG. 16 is a cross section, end view of a switching element 1602 shown in an off state. As shown, switching element 1602 may be actuated via coil 1670. In conjunction with coil 1670, magnetic pole piece 1680 may be used to actuate contact 1606. In one embodiment, magnetic pole piece 1680 may include Kovar. Also shown in FIG. 16 is a magnet 1650, which may be configured to hold contact 1606 in an off state when not actuated by coil 1670/magnetic pole piece 1680. Magnet 1650 may be referred to as a permanent magnet.

Figure 17:
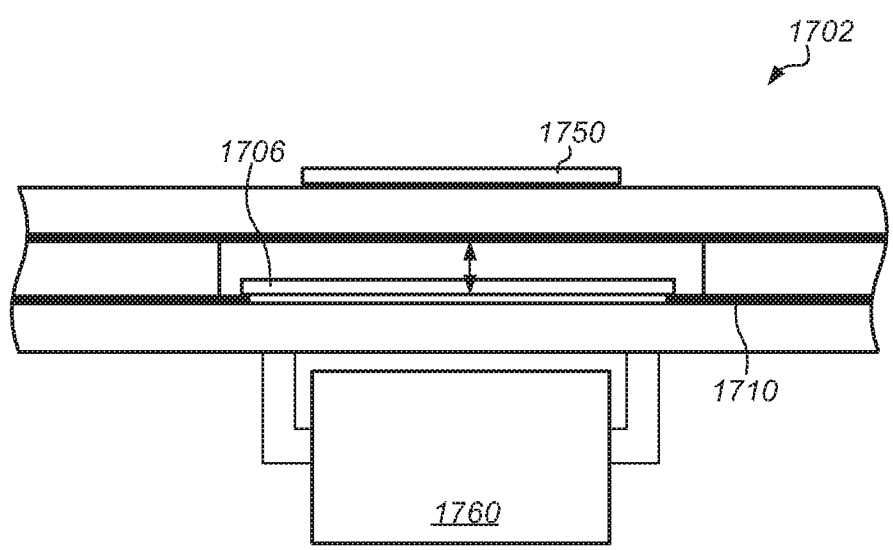

FIG. 17 is a cross section, side view of a switching element 1702 shown in an on state. Electromagnet 1760 may be coupled to the one or more PWBs and may be configured to actuate contact 1706. As shown, during actuation of contact 1706, magnet 1750 may no longer hold contact 1706 in a position in which it does not contact input/output trace 1710.

Figure 18:
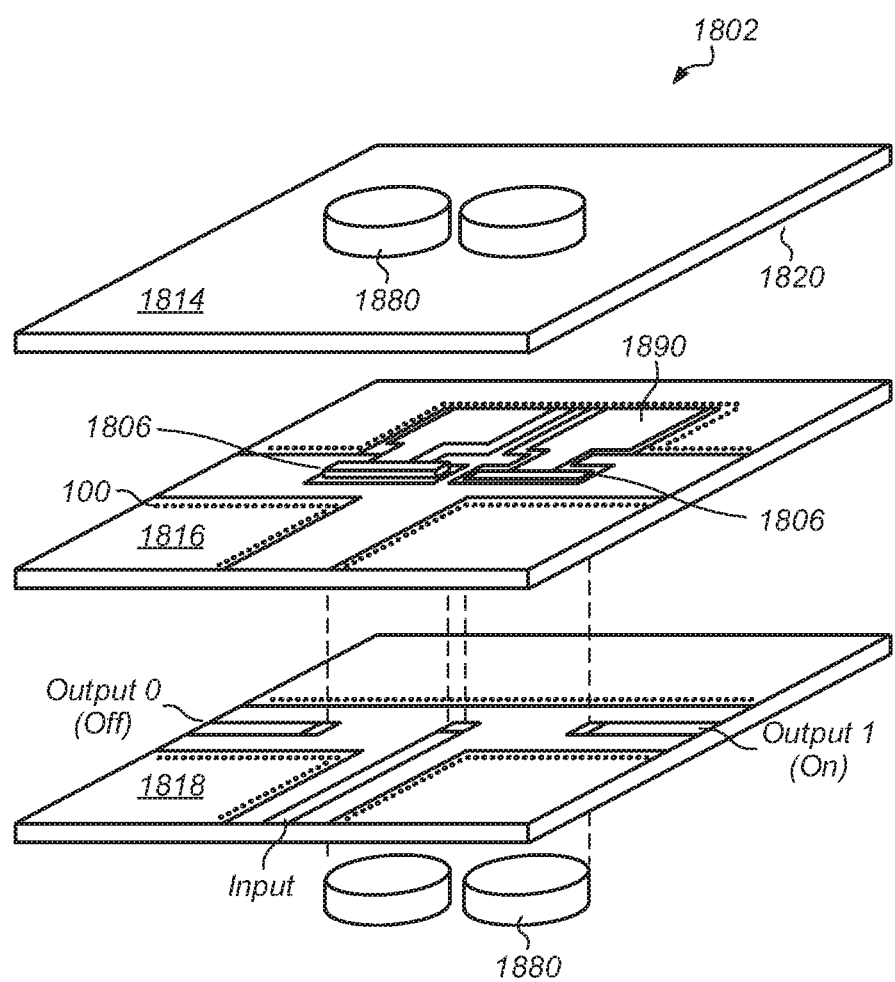
FIGS. 18-19 illustrate example switching elements, blown up by printed wiring board (PWB) layer, in accordance with one or more embodiments.
Figure 19:
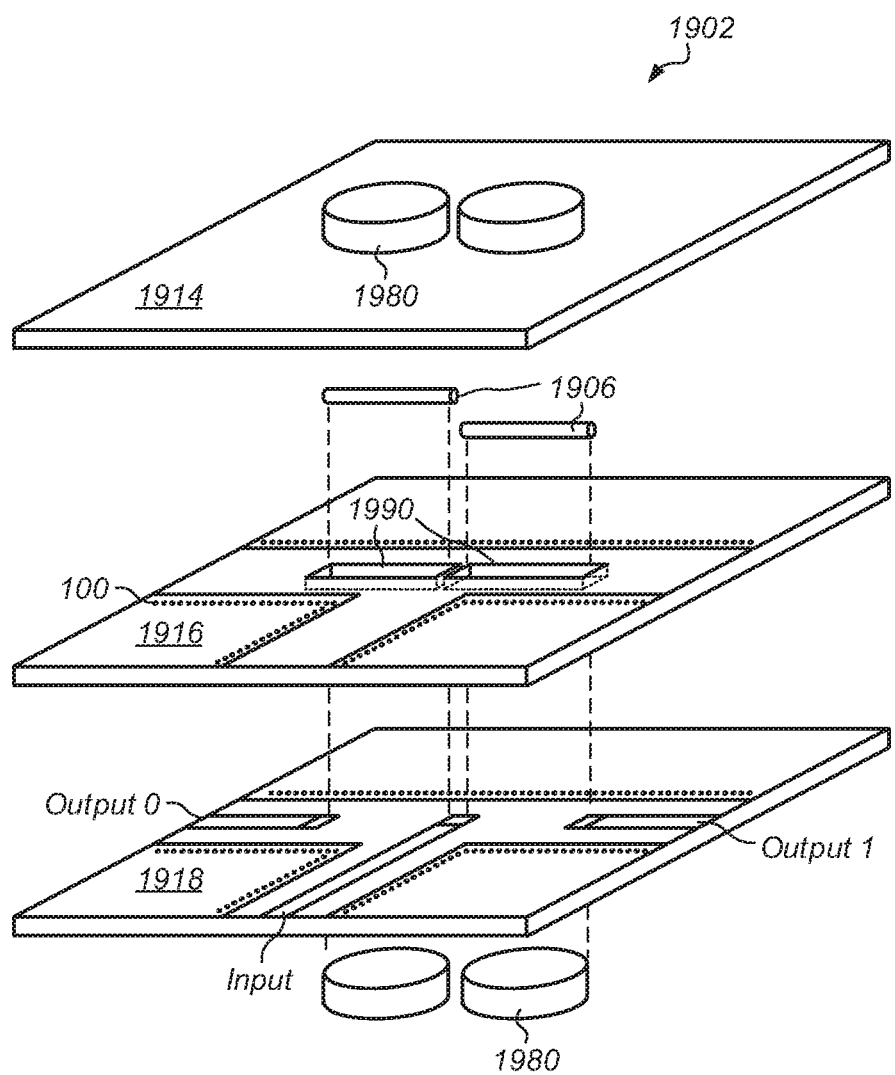

FIGS. 18-19 illustrate example Form-C switching elements in a blown up format separated by PWB layer. As shown, support layer 1814 may be referred to as PWB sheet 3 or the top PWB sheet. Spacer layer 1816 may be referred to as PWB sheet 2 or the middle PWB sheet. And the bottom most PWB layer may be referred to as motherboard 1818 or PWB sheet 1. As shown, in one embodiment, the coils or solenoids 1880 may be located on one or both proximate edges of the one or more PWBs, shown in the diagram as on top and on the bottom of the sheets. Input and output traces, shown as output 0, output 1, and input in this example, may be located/integrated in PWB sheet 1 1818. Also as shown, contacts 1806 may reside in PWB sheet 2 1816. Note that contacts 1806 may be integrated into PWB sheet 2 1816 or may simply be coupled to it. FIG. 18 depicts a bending beam method of actuating the contacts 1806. Contacts 1806 may be located on the end of bending beams and may be actuated by solenoid(s). As shown, the rightmost contact bar is making contact in a groove of PWB sheet 2 such that output 1 may be coupled to the input. Not shown, a magnet may be configured to hold the leftmost contact 1806 such that the path from the input to output 0 is in an off state. Also shown in the FIG. 18 is hinge area 1890.

FIG. 19 depicts a floating contact bar method of actuating contacts 1906. In such an embodiment, PWB sheet 2 1916 includes contact bar pockets 1990. Contacts 1906 may be loose gold-plated iron rods that fit into the PWB and may be actuated by coils 1980. Such an embodiment may result in improved isolation.

Figure 20:
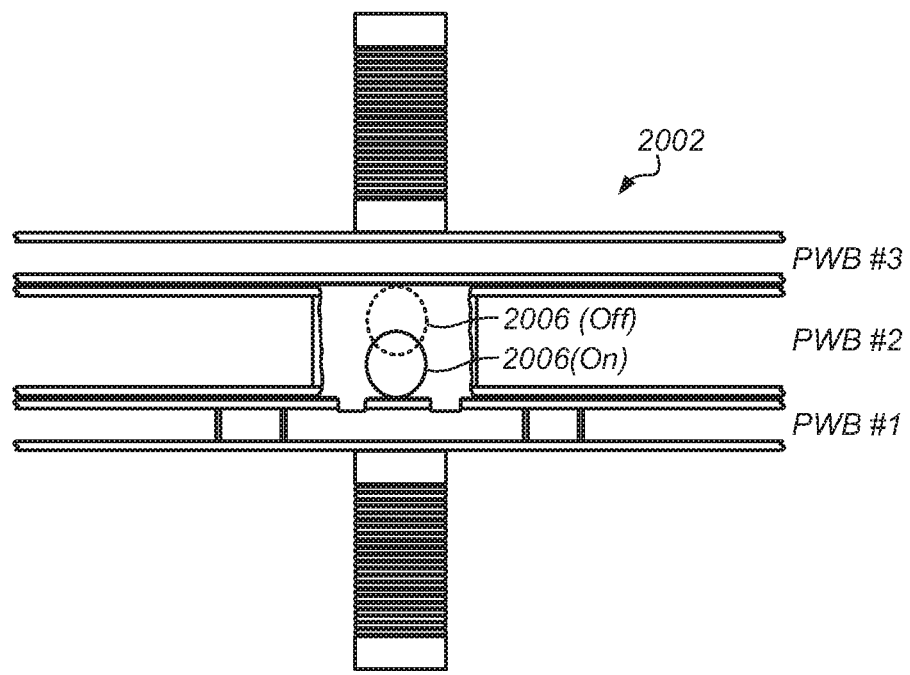
FIGS. 20-21 illustrate example switching elements in off and on modes, in accordance with one or more embodiments.
Figure 21:
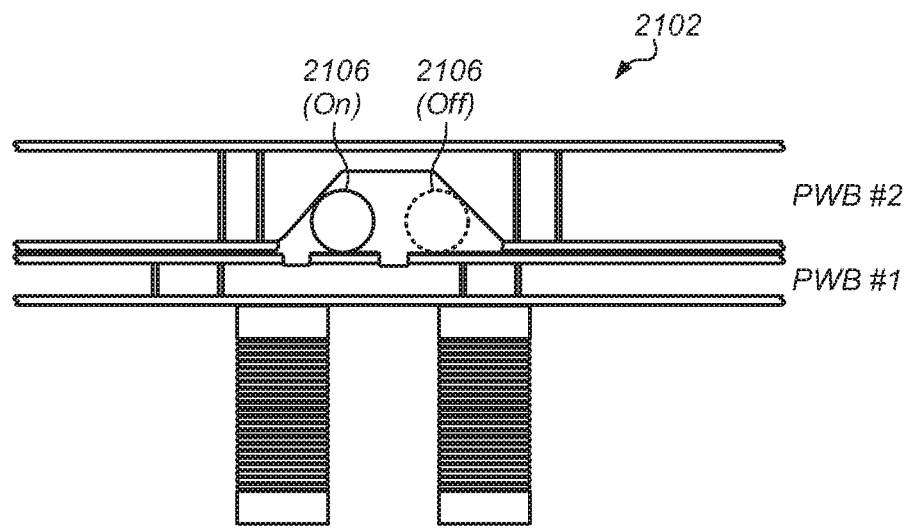

Each of FIGS. 20-21 illustrates an example switching element in both off and on modes. FIG. 20 shows a cross section through the end of a contact bar. FIG. 20 shows contact bar 2006 in both an off (upper position-dashed circle) state and in an on state (bottom position-solid circle). FIG. 21 illustrates a rolling contact bar method of actuating contacts 2106. The embodiment shown in FIG. 21 is similar to that of FIG. 20 except that the contact rods roll sideways instead of up and down (per the orientation depicted in the figure). The embodiment of FIG. 21 may allow the use of only 2 PWBs, and allow the coils to be on the same side of the PWBs.

Figure 22:
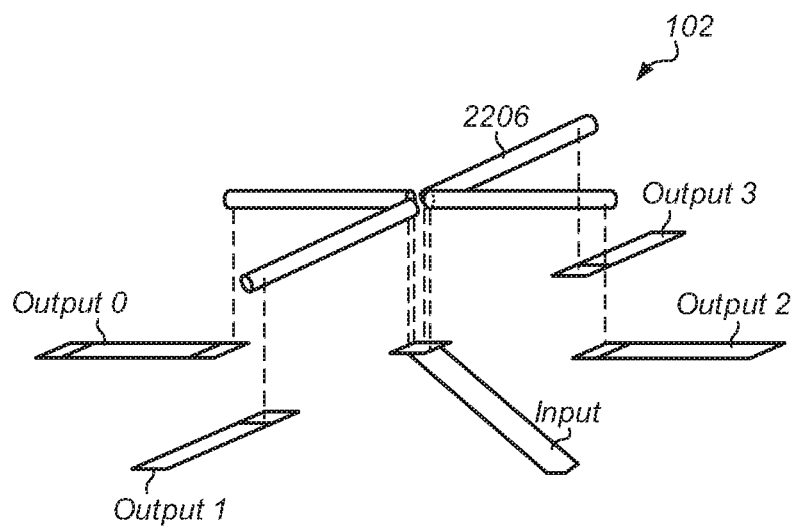
FIG. 22 illustrates an example switching element in a star configuration, according to some embodiments.

FIG. 22 illustrates an example switching element in a star configuration. Specifically, FIG. 22 illustrates an example 4×1 multiplexer switching element as described herein. Similar configurations may allow switching elements of different sizes (e.g., 6×1, 8×1, etc.). Moreover, various switching elements may be cascaded. For example, multiple 4×1 multiplexer switching elements may be cascaded to create a 16×1 multiplexer. Similar cascading may be performed, for example, as described above regarding 2×2 or other N×N switching elements. Cascading may, in some embodiments, include stacking multiple MacroMEMS. Thus, one multilayered PWB may be stacked on top of another PWB and the output of one of those PWBs may be provided as input to the other one.

Figure 23:
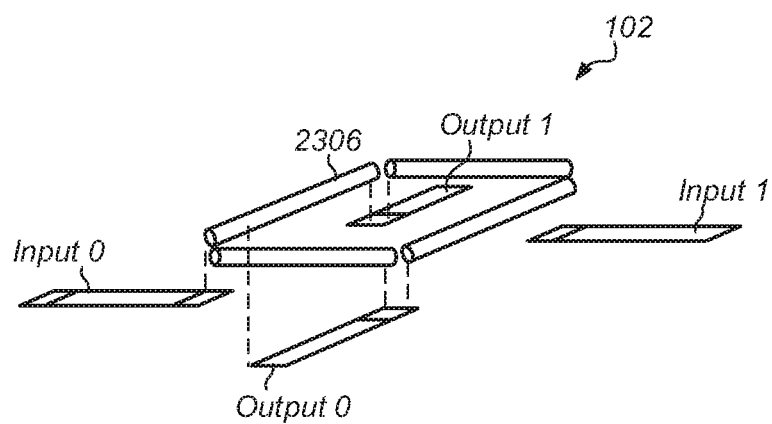
FIG. 23 illustrates an example 2×2 switching element, according to some embodiments.

FIG. 23 illustrates an example 2×2 switching element. As described herein, the 2×2 switching element may be assembled into a variety of topologies, for instance, a compact sorting networking style matrix. In such an example, a full 6×6 matrix may only use 12 2×2 elements. Matrices of other sizes (e.g., 4×8, etc.) may also be created.

The disclosed switching elements may be built and used in many configurations other than the above described multiplexers and 2×2 (N×N) switches. For instance, the switching elements may be used for self-termination, RF attenuators, and even as self-testing switches. As one example, an additional contact bar may be added off the end of each channel to connect a termination resistor for self-termination. As another example, a contact bar may be dropped onto a signal trace as part of a 4-wire Ohms self-test algorithm. In the off state, the bar may be set off to the side and ground and be invisible/transparent to normal operation. Accordingly, in such an example, no extra contacts would be in the signal path.

Switching elements, such as the disclosed microwave switches using PWB technology may provide larger contact geometry and thus greater robustness and power handling (e.g., from ESD) over conventional switches while also providing a reduced size. Performance may also be improved by integrating the transmission lines into the switches thereby avoiding a transition delay from PWB to relay. By removing relays and semi-rigid coax interconnections, size and cost may also be greatly reduced. Isolation may be improved based at least in part on high shielding effectiveness.

Figure 24:
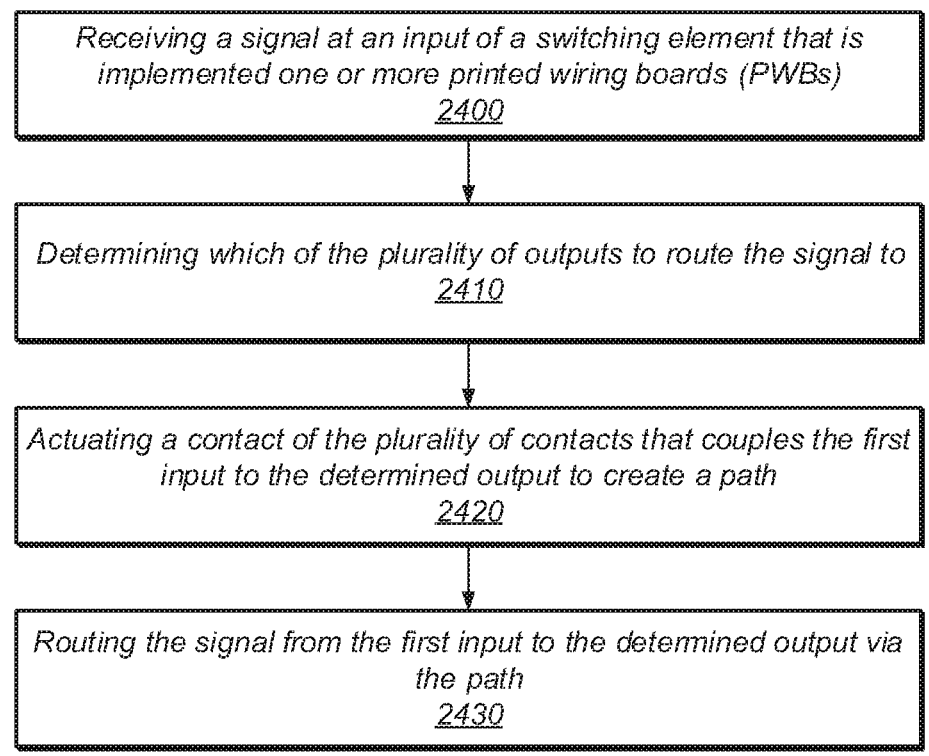
FIG. 24 illustrates a method of operating a switching element in accordance with one or more embodiments.

FIG. 24 illustrates an example method of operating a switching element. While the blocks are shown in a particular order for ease of understanding, other orders may be used. In some embodiments, the method of FIG. 24 may include additional (or fewer) blocks than shown. The method of FIG. 24 may be employed using a computer system, such as computer system 2400 below. It will be appreciated that the method of FIG. 24 is intended to be exemplary, and is not intended to limit that scope of the techniques described herein. Method steps may be added, repeated, eliminated, rearranged, and so forth. The method of FIG. 24 may be employed with various topologies, including those having 2×2 and/or other types of switching elements, as described herein.

At 2400, a signal may be received at an input of a switching element that at least partially resides in one or more PWBs. The one or more PWBs may include a first input and a plurality of outputs. A first contact of the plurality of contacts may be operable to couple the first input to one of the plurality of outputs. A second contact of the plurality of contacts may be operable to couple the first input to another one of the plurality of contacts. Other examples, as described herein, may include other numbers of inputs and/or outputs. Accordingly, another contact may be operable to couple another input to one of the plurality of contacts. In some embodiments, the one or more PWBs may also include the plurality of contacts.

As shown at 2410, to which of the plurality of outputs to route the signal may be determined. Such determining may include identifying the desired signal connectivity/routing through a switch. Determining/identifying the desired signal connectivity/routing may include identifying one or more inputs, outputs, or ports between which a signal is to be routed. For example, with regard to FIG. 9, it may be determined that a first input is to be coupled to a third output. Similar determinations may be made for routing between inputs, outputs and/or ports of any of the switching elements described herein. Accordingly, it may also be determined that a path needs to be provided between the respective ones of the inputs and outputs.

As illustrated at 2420, a contact of the plurality of contacts may be actuated. Actuating the contact may couple the first input to the determined output to create a path. One or more commands/signals may be provided switching element to set the state of the switching element and actuate the contact that couples the determined output to the first input.

At 2430, the signal may be routed from the first input to the determined output via the path.

Some of the embodiments described herein implement an N×N (e.g., 2×2, 4×4, 8×8, etc.) or N×M (e.g., 1×4, 4×1, 2×3, 2×4, etc.) switching element. The described 2×2 switching elements may include two distinct inputs and two distinct outputs. During use, the switching elements may be operated between different states. For example, a first state may connect the first input to the first output; a second state may connect the first input to the second output; a third state may connect the second input to the first output; and a fourth state may connect the second input to the second output. In such an embodiment, one of the four states may be active at a time such that only one of the inputs may be connected to one of the outputs. In other embodiments, multiple paths may be connected simultaneously. For example, the switching elements may be operated between two distinct states. A first state (e.g., a straight-through or pass-through state) that connects the first input to the first output and simultaneously connects the second input to the second output, and a second state (e.g., a swap state) that connects the first input to the second output and simultaneously connects the second input to the first output.

Although the paths/terminals are discussed with regard to inputs and outputs to provide clarity and consistency with regard to input/output (I/O) paths/terminals labeled as inputs (e.g., inputs 104) and outputs (e.g., outputs 106), in some embodiments, the resulting conductive path may be used to route signals in either direction (e.g., from outputs to inputs of from inputs to outputs).

As described herein, pairs/sets of signals may be routed in a substantially similar manner by employing, at each of the switching element locations 102, multiple 2×2 or larger switching elements to effectively provide functionality of multi-wire signal routing. Some or all of 2×2 switching elements 102 may be other types of switching elements, such as 4×4 switching elements, 8×8 switching elements, and so forth, while still preserving the overall topology of the switching network (e.g., Cylindrical, J-type, or sorting). As described herein, much larger multi-dimensional switching systems may be created by employing, at each of the switching element locations 102, multi-dimensional switching elements (e.g., 4×4 and 8×8), each of which may itself be a different topology (e.g., Cylindrical, J-type, sorting network, or even conventional crosspoint) as long as it forms a valid N×N switch matrix.

Figure 25:
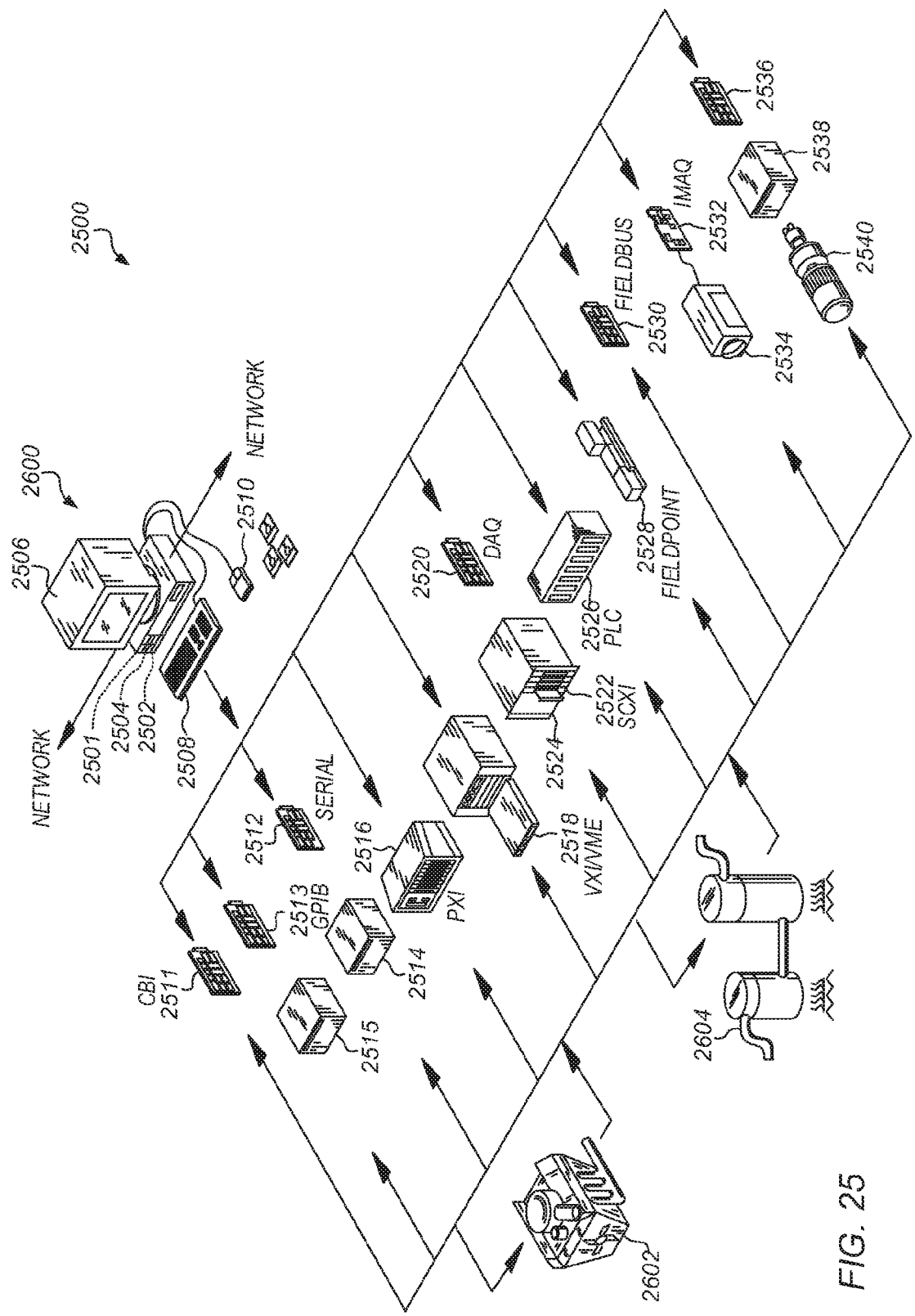
FIG. 25 illustrates an example measurement/control system in accordance with one or more embodiments of the present technique.

In some embodiments, some or all of the above described techniques may be implemented via an application executed on a computer that facilitates communication with corresponding switch/relay hardware. FIG. 25 illustrates an exemplary measurement/control system ("computer system") 2500 in accordance with one or more embodiments of the present technique. Computer system 2500 may implement one or more embodiments of the present technique. For example, an application module stored an executed by computer system 2500 may be executed to implement solving and implementing switch conditions, modeling a switch via a sorting network, or the like. Computer system 2500 may include various combinations of hardware and software that include devices that can be used to implement various computer based processes.

In the illustrated embodiment, computer system 2500 includes a host computer system 2600. Host computer system 2600 may be operable to execute computer programs/routines that provide various computer related functions, such as those for employing a switch matrix as described herein. For example, instructions for implementing the techniques described herein may be stored an executed by one or more modules 2501 (e.g., a sorting module) of the computer systems/device of computer system 2500, such as host computer system 2600. Moreover, any of the switch topologies and related techniques described herein may be implemented in a switch/relay module provided within system 2500. Host computer system 2600 may include various components such as central processing unit (CPU) 2502 and a memory medium 2504. Memory medium 2504 may include a tangible non-transitory computer readable storage medium, such as random access memory (RAM), flash memory, hard-drives, and/or CD-ROMs, or the like. Memory medium 2504 may have program instructions stored thereon that are executable (e.g., by CPU 2502) to implement one or more computer implemented methods, such as those for employing a switch matrix as described herein as described herein. In the illustrated embodiment, host computer system 2600 includes a display device (e.g., a monitor) 2506, an alphanumeric input device (e.g., a keyboard) 2508, and a directional input device (e.g., a mouse) 2510. In some embodiments, host computer system 2600 may include modular and/or plug-in boards/cards (e.g., with either commercially available or proprietary hardware) that may be added via a number of expansion slots internal or external to the computer body. For example, host computer system 2600 may include PCI/PCI Express slots and PCI/PCI Express cards disposed therein. As described in more detail below, host computer system 2600 may be connected to one or more devices, such as an expansion chassis for connecting to a various number and combination of devices. In certain embodiments, host computer system 2600 and/or other portions of computer system 2500 may be connected to one or more other devices via a network, such as an internal network (e.g., a local area network (LAN)) and/or an external network (e.g., the internet). In certain embodiments, host computer system 2600 may be used for various input/output (I/O) functions and processing tasks. For example, host computer system 2600 may be used for data acquisition (DAQ) (e.g., when a DAQ digitizing board is installed in computer 2600 or a device coupled thereto, such as a chassis, and associated software is run).

Host computer system 2600 may be configured to connect/communicate with other instruments/devices of computer system 2500. In some embodiments, host computer system 2600 may operate with the one or more devices of computer system 2500 to generate and provide data, to acquire data, to analyze data. For example, computer system may communicatively couple to and control one or more devices 2602, processes 2504, or the like. In some embodiments, devices 2602 may include universal serial bus (USB) devices. Host computer system 2600 may operate with the one or more devices in communication with device 2602 or process 2604 to perform an automation function, such as MMI (Man Machine Interface), SCADA (Supervisory Control and Data Acquisition), portable or distributed data acquisition, process control, advanced analysis, or other data acquisition and control functions. For example, computer system 2500 may be used to implement data acquisition and control applications, test and measurement applications, image acquisition and processing application, machine vision processing applications, process control applications, man-machine interface applications, simulation applications, hardware-in-the-loop validation applications, motion control applications, computer based instruments (CBI) applications, signal conditioning (SCXI) applications, or the like. One or more of the instruments/devices of computer system 2500 may include a programmable hardware element, using an FPGA or a processor and memory, and/or one or more portions of user code.

Computer system 2500 may include a variety of devices. For example, computer system 2500 may include modular instrumentation devices, such test and measurement devices manufactured by National Instruments Corporation, headquartered in Austin, Tex. In some embodiments, computer system 2500 may include computer based instrumentation (CBI) 2511, such as a digital multi-meter (DMM), an oscilloscope (SCOPE), a radio-frequency (RF) device (e.g., up-converter or down-converter), an arbitrary waveform generator (ARB), or the like. Computer system 2500 may include general purpose interface bus (GPIB) device 2513, such as a modular GPIB card used to communicate with a GPIB device 2515 (e.g., an oscilloscope) via a GPIB communication protocol. Computer system 2500 may include a serial device 2512, such as a modular serial card used to communicate with a serial device 2514 (e.g., an oscilloscope) via a serial communication protocol. Computer system 2500 may include a (PXI) device 2516, such as a PXI chassis having PXI form factor modular devices (e.g., modules) installed therein. Computer system 2500 may include a (VXI/VME) device 2518, such as a VXI/VME chassis having VXI/VME form factor modular devices (e.g., VXI/VME controllers/modules) installed therein. Computer system 2500 may include data acquisition (DAQ) device 2520, such as modular instrumentation including data input/output (I/O) interfaces for receiving, transmitting, conditioning, and/or processing signals (e.g., digital and analog signals). Computer system 2500 may include signal conditioning (SCXI) devices 2522 that can be used to condition and/or route signals, such as I/O signals as those transmitted/received at DAQ device 2520. SCXI device 2522 may include a chassis 2524 having devices 2522 installed therein (e.g., a relay/switch module having a relay/switch matrix employing any one of the topologies described herein). Computer system 2500 may include a programmable logic controller (PLC) 2526, such as a PLC used for the automation of electromechanical process. Computer system 2500 may include a distributed I/O module, such as a fieldpoint module 2528. Computer system 2500 may include a distributed control module, such as a fieldbus module 2530. Computer system 2500 may include an image acquisition (IMAQ) system, such as a modular IMAQ module 2532 and an associated IMAQ device (e.g., camera) 2534. Computer system 2500 may include a motion control system, such as a modular motion controller device 2536, a motor drive 2538, and a motor 2540. Computer system 2500 may include any variety of other devices. Although some of the devices are illustrated in association with a chassis (e.g., modules) and some are illustrated independent from a chassis (e.g., card or standalone devices), embodiments may include all or some of the described device being provided in a module form factor to be housed in a chassis and/or a card form factor be installed in computer 2600. For example, PXI device 2516 may include a PXI chassis housing any combination of modular CBI devices, GPIB devices, serial devices, SCXI devices, DAQ devices, IMAQ devices, motion devices, or the like. For example a PXI form factor switch module having a relay/switch matrix a relay/switch matrix (e.g., employing any one of the topologies described herein) may be provided. In some embodiments, a switch element, such as one described herein, may be provided on a carrier that is disposed in a PXI module (e.g., a 6×6 PXI module) housed in a PXI chassis. The devices may also be provided in a PCI form factor and installed in PCI slots of computer 2600. In some embodiments, computer system 2600 may include a test and measurement device, such as a digital multimeter (DMM). In some embodiments, the DMM may employ the techniques discussed herein to test relays of a switch coupled thereto. For example, the DMM may be used to measure the connectivity or resistance between two channels of the switch when appropriate as described above with regard to the test routine.

Computer system 2500 may store and/or execute a driver used to control one or more aspects of operation of computer system 2500. For example, where a switch module includes a switch system (e.g., switch system 117, 117' or 117"), a switch hardware/software driver application may retrieve or otherwise associate a sorting network model (e.g., model 122, 122' or 122") with the switch hardware.

Although the embodiments above have been described in considerable detail, numerous variations and modifications will become apparent to those skilled in the art once the above disclosure is fully appreciated. It is intended that the following claims be interpreted to embrace all such variations and modifications. Furthermore, note that the word "may" is used throughout this application in a permissive sense (e.g., having the potential to, being able to), not a mandatory sense (e.g., must). The term "include," and derivations thereof, mean "including, but not limited to." As used in this specification, the singular forms "a," "an," and "the" include plural referents unless the content clearly indicates otherwise. Thus, for example, reference to "a device" includes a combination of two or more devices.

We claim:

1. An analog switching element that is at least partially implemented in one or more printed wiring boards (PWBs), comprising:
 a plurality of inputs and a plurality of outputs integrated into the one or more PWBs;
 a plurality of electromagnets coupled to or comprised in at least one of the one or more PWBs; and
 a plurality of contact bars, wherein each contact bar is comprised in a respective contact bar pocket bounded at least partially by at least one of the PWBs, wherein each contact bar comprises a conductive metal or alloy that is attracted by a magnetic field, wherein each of the contact bars, via actuation by an externally applied magnetic field of a respective one of the plurality of electromagnets, is selectively operable in:
   a first state, wherein the at least one contact bar couples one of the plurality of inputs to one of the plurality of outputs such that an analog signal input to the respective input is routed to the respective output; and
   a second state, wherein the at least one contact bar is held in an off state.

2. The analog switching element of claim 1, wherein the contact bar pocket includes a shielding conductive metal.

3. The analog switching element of claim 1, wherein each respective contact bar pocket is electrically shielded, and wherein the magnetic field penetrates the contact bar pocket.

4. The analog switching element of claim 3, wherein the magnetic field penetrates the contact bar pocket without requiring an opening of the contact bar pocket.

5. The analog switching element of claim 1, wherein a contact bar in the first state creates a stub-less signal path.

6. The analog switching element of claim 1, wherein each contact bar is substantially cylindrical, and wherein each contact bar rolls between the first state and the second state in response to the externally applied magnetic field.

7. The analog switching element of claim 1, wherein a first of the plurality of inputs provides a self-test signal, wherein a first contact bar, coupled to the first input, receives the self-test signal, and wherein a second contact bar, coupled to one of the plurality of outputs, is configured to allow measurement of a response of the switching element to the self-test signal.

8. The analog switching element of claim 1, wherein a contact bar, when in the off state, does not conduct interference to a signal received at the plurality of inputs.

9. The analog switching element of claim 1, wherein each of the plurality of electromagnets comprises an electropermanent magnet assembly that includes a first magnet, a second magnet coupled to the first magnet, and a coil wrapped around the second magnet, wherein the first magnet has a high coercivity and the second magnet has a low coercivity.

10. The analog switching element of claim 9, wherein the coil is wrapped around both the first magnet and the second magnet.

11. The analog switching element of claim 9, wherein, responsive to a current being run through the coil, a polar orientation of the second magnet is reversed.

12. The analog switching element of claim 9, wherein a first polar orientation of the second magnet corresponds to the first state and wherein a second polar orientation of the second magnet corresponds to the second state.

13. The analog switching element of claim 1, wherein each of the plurality of contact bars includes a first metal and a second metal, wherein the first metal is non-magnetic and wherein the second metal is magnetic.

14. The analog switching element of claim 13, wherein end portions of each contact bar include the first metal and wherein a portion of each contact bar between the end portions includes the second metal.

15. The analog switching element of claim 1, wherein each contact bar includes a plurality of electrical contacts, wherein the electrical contacts are mounted on an extension.

16. The analog switching element of claim 15, wherein the extension comprises a plurality of contacts mounted on a conductive spring alloy.

17. The analog switching element of claim 1, wherein each respective contact bar pocket contains a damping fluid.

18. The analog switching element of claim 9, wherein the electropermanent magnet assembly further includes a plurality of pole pieces coupled to the first magnet and the second magnet.

19. A method for routing signals, comprising:
   receiving a signal at an input of a switching element, wherein the switching element at least partially resides in one or more printed wiring boards (PWBs) that include:
     a plurality of electromagnets, coupled to or comprised in at least one of the one or more PWBs; and
     a plurality of inputs and a plurality of outputs, wherein a first contact bar of a plurality of contact bars is operable, via actuation by an externally applied magnet field of a first respective one of the plurality of electromagnets, to couple a first of the plurality of inputs to one of the plurality of outputs, and wherein a second contact bar of the plurality of contact bars is operable, via actuation by an externally applied magnet field of a second respective one of the plurality of electromagnets, to couple the first input to another one of the plurality of outputs;
   determining which of the plurality of outputs to route the signal to;
   actuating, via an externally applied magnetic field of a respective electromagnet, a contact bar of the plurality of contact bars that couples the first input to the determined output to create a path; and
   routing the signal from the first input to the determined output via the path.

20. A switch system, comprising:
   a plurality of switch inputs and a plurality of switch outputs integrated into one or more printed wiring boards (PWBs);
   a switch matrix comprising a plurality of switching elements configured to selectively couple one or more of the plurality of switch inputs to one or more of the plurality of switch outputs during use to provide one or more paths for routing signals from one or more of the switch inputs to one or more of the switch outputs, and
   a plurality of electromagnets coupled to or comprised in at least one of the one or more PWBs,
   wherein each of the switching elements comprises:
     one or more contact bars,
     one or more inputs, and
     one or more outputs,
     wherein the one or more inputs and the one or more outputs are integrated into the one or more PWBs, and
     wherein each of the one or more contact bars is operable, via actuation by an externally applied magnetic field of a respective one of the plurality of electromagnets, to couple a respective one of the one or more inputs to a respective one of the one or more outputs;
   wherein each switching element is selectively operable in:
     a first state, wherein the one or more contact bars couples one of the one or more inputs to one of the one or more outputs such that an analog signal input to the respective input is routed to the respective output, and
     a second state, wherein the one or more contact bars are held in an off state.

* * * * *